(12) United States Patent
Cuyt et al.

(10) Patent No.: US 9,690,749 B2
(45) Date of Patent: Jun. 27, 2017

(54) SMART DATA SAMPLING AND DATA RECONSTRUCTION

(75) Inventors: Annie Cuyt, Wilrijk (BE); Wen-Shin Lee, Berchem (BE)

(73) Assignees: UNIVERSITY OF ANTWERP, Antwerp (BE); Wen-Shin Lee, Berchem (BE)

( * ) Notice: Subject to any disclaimer, the term of this patent is extended or adjusted under 35 U.S.C. 154(b) by 612 days.

(21) Appl. No.: 14/239,303

(22) PCT Filed: Aug. 20, 2012

(86) PCT No.: PCT/EP2012/066204
§ 371 (c)(1),
(2), (4) Date: Feb. 18, 2014

(87) PCT Pub. No.: WO2013/024177
PCT Pub. Date: Feb. 21, 2013

(65) Prior Publication Data
US 2014/0195200 A1 Jul. 10, 2014

Related U.S. Application Data

(60) Provisional application No. 61/611,899, filed on Mar. 16, 2012.

(30) Foreign Application Priority Data

Aug. 18, 2011 (GB) .................................. 1114255.1
Nov. 17, 2011 (GB) .................................. 1119856.1

(51) Int. Cl.
*G06F 17/10* (2006.01)
*H03M 7/30* (2006.01)

(52) U.S. Cl.
CPC .......... *G06F 17/10* (2013.01); *H03M 7/3062* (2013.01)

(58) Field of Classification Search
CPC ....... G06F 17/10; H03M 7/3062; H03M 7/30; H03M 1/1285; G01R 33/5611; G06T 11/006; G06T 11/003
See application file for complete search history.

(56) References Cited

U.S. PATENT DOCUMENTS 5,663,896 A * 9/1997 Aucsmith ............. H04L 9/0822
380/279
7,646,924 B2 1/2010 Donoho
(Continued)

FOREIGN PATENT DOCUMENTS

WO 02078204 A1 10/2002

OTHER PUBLICATIONS

Giesbrecht et al. Symbolic-numeric Sparse Interpolation of Multivariate Polynomials, Sep. 4, 2008, pp. 1-22.*
(Continued)

*Primary Examiner* — John Breene
*Assistant Examiner* — Mohammad Islam
(74) *Attorney, Agent, or Firm* — Workman Nydegger

(57) ABSTRACT

A computer-based method for characterizing data dependent on at least one variable is described. The method comprises sampling the data in a smart manner by sampling the data in a finite sequence of sampling points, the finite sequence of sampling points being controlled by a magnifying factor for controlling a spacing between elements of the finite sequence of sampling points and being determined such that function values of functions of a family of functions in said finite sequence of sampling points satisfy a recurrence relation. A corresponding device also is described as well as software-related products.

16 Claims, 12 Drawing Sheets

(56) References Cited

U.S. PATENT DOCUMENTS

| | | | |
|---|---|---|---|
| 7,991,095 B2 | 8/2011 | Vetterli et al. | |
| 8,031,820 B2 | 10/2011 | Vetterli et al. | |
| 8,077,757 B2 | 12/2011 | Maravic et al. | |
| 8,160,194 B2 | 4/2012 | Vetterli et al. | |
| 8,213,554 B2 | 7/2012 | Blu et al. | |
| 8,848,921 B2* | 9/2014 | Tang | H04L 9/0833 380/279 |
| 9,064,136 B1* | 6/2015 | Ni | G06G 7/161 |
| 2003/0044004 A1* | 3/2003 | Blakley | G06F 7/72 380/28 |
| 2006/0029279 A1 | 2/2006 | Donoho | |
| 2007/0143078 A1* | 6/2007 | Vetterli | H03M 1/1285 702/189 |
| 2007/0183535 A1 | 8/2007 | Maravic et al. | |
| 2008/0270055 A1* | 10/2008 | Rozell | G06G 7/26 702/71 |
| 2009/0068951 A1* | 3/2009 | Mishali | H04B 1/667 455/59 |
| 2009/0191814 A1* | 7/2009 | Blu | G06F 17/10 455/63.1 |
| 2010/0011268 A1* | 1/2010 | Sinop | G06K 9/6247 714/746 |
| 2010/0042374 A1 | 2/2010 | Vetterli et al. | |
| 2010/0246729 A1 | 9/2010 | Vetterli et al. | |
| 2010/0306525 A1* | 12/2010 | Ferguson | H04L 63/0442 713/151 |
| 2010/0310011 A1* | 12/2010 | Sexton | H03M 1/129 375/316 |
| 2011/0007606 A1* | 1/2011 | Curtis | G01S 15/04 367/103 |
| 2011/0051990 A1* | 3/2011 | Dean | G06T 1/00 382/100 |
| 2012/0053948 A1* | 3/2012 | Mustiere | H03M 7/30 704/500 |
| 2013/0187682 A1* | 7/2013 | Eldar | H03K 5/00 327/91 |

OTHER PUBLICATIONS

Annie Cuyt et al., "A new algorithm for sparse interpolation of multivariate polynomials", Theoretical Computer Science, vol. 409, No. 2, Dec. 2008, pp. 180-185. www.elsevier.com/locate/tcs.

Annie Cuyt et al., "Reconstructing Sparse Trigonometric Functions", ACM Communications in Computer Algebra, vol. 44, No. 3, Sep. 2010, pp. 101-102.

International Search Report from corresponding International PCT Application No. PCT/EP2012/066204, Oct. 18, 2012.

Massey, James L., "Shift-Register Synthesis and BCH Decoding", IEEE Transactions on Information Theory, vol. IT-15, No. 1, Jan. 1969, pp. 122-127.

Schmidt, Ralph O., "Multiple Emitter Location and Signal Parameter Estimation", IEEE Transactions on Antennas and Propagation, vol. AP-34, No. 3, Mar. 1986, pp. 276-280.

Roy, Richard, et al., "ESPRIT—Estimation of Signal Parameters Via Rotational Invariance Techniques", IEEE Transactions on Acoustics, Speech, and Signal Processing, vol. 37, No. 7, Jul. 1989, pp. 984-995.

Hua, Yingbo et al., "Matrix Pencil Method for Estimating Parameters of Exponentially Damped/Undamped Sinusoids in Noise", IEEE Transactions on Acoustics, Speech, and Signal Processing, vol. 38, No. 5, May 1990, pp. 814-824.

Kaltofen, Erich et al., "Early Termination in Sparse Interpolation Algorithms", Journal of Symbolic Computation, vol. 36, Mar. 19, 2003, pp. 365-400.

Candes, Emmanuel J. et al., "An Introduction to Compressive Sampling", IEEE Signal Processing Magazine, vol. 25, No. 2, Mar. 2008, pp. 21-30.

Giesbrecht, Mark et al., "Symbolic-Numeric Sparse Interpolation of Multivariate Polynomials", Journal of Symbolic Computation, vol. 44, 2009, pp. 943-959.

* cited by examiner

SMART DATA SAMPLING AND DATA RECONSTRUCTION

FIELD OF THE INVENTION

The invention relates to the field of collection, processing, characterising, modelling and/or reconstruction of data. More particularly, the invention relates to a method and apparatus for sampling, processing, characterising, representing, modelling and/or reconstructing data obtainable in a sample space, such as univariate signals, for example time series of measurements, spatial signals, for example images, or multivariate signals.

BACKGROUND OF THE INVENTION

In many fields today, analog and digital signals are sampled at spaced time intervals to form digital representations for storage, analysis, processing, transmission, reproduction, and other uses. These signals may include, but are not limited to, sounds, images, time-varying measurement values, sensor data such as bioelectrical data like electroencephalography data (EEG), electrocardiography data (ECG), electromyography data (EMG), electrolaryngraphy data (ELG), electro-oculography data (EOG), control system signals that control other devices or systems, and telecommunication transmission signals. The signal measurements are often intended to depict the state of an object for measurement, which may be a patient's brain as in an EEG, or a picture of the earth as in a seismic survey. Therefore, in each case, it is desirable to obtain an acceptable-quality reconstruction of the signal. The term "acceptable-quality reconstruction" herein refers to a reconstruction with a level of precision sufficient to depict the state of the object faithfully for the selected application.

Today, many fields have their own accepted practice for the number of measurements, commonly expressed as a "sampling rate", required to obtain an acceptable-quality reconstruction. Many of them are restricted by the Nyquist-Shannon theorem, which states that in order to reconstruct a signal without aliasing artifacts, the signal must be sampled at above twice the bandwidth or the highest frequency component of the signal in the case of baseband sampling, which sampling rate is commonly referred to as the "Nyquist rate." To reduce the sampling rate below the current practice or below the Nyquist rate while still obtaining an acceptable-quality reconstruction would have many benefits such as reduced costs and measurement time.

Throughout computational science and engineering, several methods are known to represent data in such a parsimonious way. To reduce the sampling rate below the Nyquist rate, mathematical models are proposed in which the major features of the data are represented using an expression with only a few terms, in other words, models that use a "sparse" combination of generating elements taken from a set. A representation is called t-sparse if it is a combination of only t elements. Such mathematical models make use of the sparse nature of the data of interest. The terms sparse (and "sparsity") here mean any data that have a small number of dominating terms in the model or representation compared to the number of all the terms. These mathematical models consist of a sparse combination of terms taken from a plurality of functions in the expression. When the plurality of functions forms a basis, the sparse combination becomes unique. By allowing a larger set of functions, different sparse combinations may represent the data, e.g. a plurality of different combinations may provide equivalent representations of the data. Often, modelling problems deal with a mixture of diverse phenomena, and therefore a plurality of sparse combinations of terms from different sources or bases may be useful. In addition, nonlinear models are possible that consist of a quotient of sparse linear combinations.

Besides the accuracy of a representation, a model's sparsity has really become a priority. The degree of sparsity affects the achievable level of compression, whether in sampling or in reconstruction. A sparser model means a higher degree of compression of the data, less collection of the data, as well as reduced storage needs or transmission of the data and a reduced complexity of the mathematical model for analysing such data. It may be assumed hereinafter that the given data behave more or less in accordance with a sparse combination of elements taken from a specific set. The aim is then to determine both the support of the sparse combination and the scalar coefficients in the representation, from a small or minimal amount of data samples. It makes no sense to collect vast amounts of data merely to compress these afterwards. Ideally the required data samples may not depend on the specific object that one is dealing with and contain enough information to reconstruct it. Sparse techniques may therefore solve the problem statement from a number of samples proportional to the number of terms in the representation rather than the number of available data points or available generating elements for the model.

Prior art methods utilizing the sparse characteristic to reduce the measurement rates include compressed sensing, see for example U.S. Pat. No. 7,646,924, and finite rate of innovation, see for example U.S. Patent Application No. US 2010/0246729. Each approach has its advantages and limitations. One method may be more suitable in one application while another method is more suitable in another application. Thus, it would be highly desirable to have multiple methods that can give an acceptable-quality reconstruction of the signal from a reduced number of measurements compared to the current practice.

In compressed sensing, down-sampling is performed randomly, hence introducing a probabilistic element which may cause the reconstruction to fail. The gain in samples offered by the technique also comes at a price: the complexity of the optimization algorithms used to recover an approximation to the original signal is higher than the traditional FFT-based algorithms using Nyquist-rate based sampling. In the finite rate of innovation technique the sampling does not take place in the time or spatial domain. Also, the sampling is aimed at picking up the pulses in the signal and so noise significantly influences the result.

In coding theory however, the reconstruction of a t-sparse object in a higher dimensional space may theoretically be achieved using only 2t samples, which is the absolute minimum. With one more sample it is even possible to reveal the correct value of t. But it is widely believed, that a similar result does not hold in a noisy numeric environment, among other things because the decoding algorithm finds the support of the sparse representation by rooting a polynomial, which may be an extremely ill-conditioned problem.

While the present disclosure uses signal processing as the example for illustrating the invention, one skilled in the art will understand that the invention is not limited to the field of signal processing but to the collection, processing, and reconstruction of all data that demonstrate sparsity.

SUMMARY OF THE INVENTION

It is an object of embodiments of the present invention to provide good and efficient methods and means for representing data, e.g. for the sparse representation of data.

It is an advantage of at least some embodiments of the present invention that a sparse representation of data may be provided that often only requires the theoretical minimal sample usage, being twice the cardinality of the support, even in the presence of noise.

It is an advantage of at least some embodiments of the present invention that a sparse representation of data may be provided by selecting an advantageous distribution of the data samples.

It is an advantage of at least some embodiments of the present invention that a sparse representation of data may be provided in which the conditioning of the involved numerical processes is controlled efficiently.

It is an advantage of at least some embodiments of the present invention that a sparse representation of data may be obtained from less measurements than dictated by the Nyquist rate.

It is an advantage of at least some embodiments of the present invention that an acceptable quality sparse representation may be provided in which the cardinality of the support may be determined iteratively or by a numerical sparsity test condition.

It is an advantage of at least some embodiments of the present invention that an acceptable quality sparse representation may be provided at a low computational complexity cost.

It is an advantage of at least some embodiments of the present invention that an overall sparse data representation may be provided that may be constructed from smaller size partial problems.

It is an advantage of at least some embodiments according to the present invention that an appropriate representation of data can be obtained, by working with some select 2t samples obtained at smart locations, in other words locations such that the functions in the plurality of functions when evaluated in the plurality of sample points satisfy a recurrence relation. The algorithmic complexity for the reconstruction of the signal, can be as low as quadratic in t (without an additional effort it is no higher than cubic in t).

It is an advantage of at least some embodiments according to the present invention, that a sampling technique is obtained that is, when applicable, computationally more efficient than compressed sensing, in the data collection step as well as in the modelling step.

It is an advantage of at least some embodiments according to the present invention, that a denoising step and the required annihilation property in the finite rate of innovation based method can be avoided.

The above objective is accomplished by a method and device according to the present invention.

In a first aspect, the present invention provides a computer-based method for characterising data dependent on at least one variable. Thus, a method according to embodiments of the present invention may be a method for obtaining an acceptable-quality reconstruction of data, e.g. a signal. The method comprises obtaining a family of functions having a domain corresponding to the at least one variable and a codomain corresponding to the data. The family of functions also may be referred to as a plurality of functions. The functions of the family of functions share a common construction parameterized by at least one parameter. Thus, a method according to embodiments of the present invention may comprise identifying a signal, in which the signal f may be represented by a sparse representation.

The method further comprises obtaining, e.g. selecting a magnifying factor or retrieving a previously stored or previously implemented value for controlling a spacing between elements in a finite sequence of sampling points wherein the data will be sampled. Obtaining the magnifying factor may be determining the magnifying factor in an automated and/or automatical way by the computer-based method. The finite sequence of sampling points may also be referred to as a plurality of sampling points. Obtaining a magnifying factor may, for instance, but not solely, be performed for controlling a numerical conditioning of the characterising of the data. Alternatively or in addition thereto, obtaining also may be performed for reducing the number of samples below the Nyquist rate, or for any other suitable reason, . . . . Furthermore, the method comprises the step of obtaining a finite sequence of measurements of the data by sampling the data in a finite sequence of sampling points. The finite sequence of measurements also may be referred to as a plurality of measurements. This finite sequence of sampling points is being controlled by the magnifying factor and is being determined such that the values of the functions of said family of functions in said finite sequence of sampling points satisfy a recurrence relation. The finite sequence of sampling points is thereby controlled by the obtained magnifying factor. The spacing between different sampling points may be unequal, but regular. Thus, a method according to embodiments of the present invention, may comprise smart sampling the signal to obtain the finite sequence of measurements. The method further comprises outputting a property of the data taking into account the finite sequence of measurements. Such a property may be a representation of the data, but alternatively also may be a degree of numerical conditioning, a cardinality, an identification of the parameters in the sparse representation, etc. The method furthermore may comprise determining a subset of the family of functions, said determining making use of said recurrence relation satisfied in said finite sequence of sampling points. In a method according to embodiments of the present invention, this determining may comprise developing a matrix structure from the recurrence relation, in which the dimension of the matrix may be at least t×t, in which t denotes the cardinality of the support. In a method according to embodiments of the present invention, this determining of the subset may comprise developing a data matrix from the finite sequence of measurements in accordance with the matrix structure.

Outputting a property of the data may comprise outputting a representation of the data based on the subset of said family of functions. In a method according to embodiments of the present invention, the method may comprise (re) constructing a sparse representation for the data from the data matrix.

Function parameters defining functions of the determined subset of said family of functions may at least not all be integer.

In a method according to embodiments of the present invention, the magnifying factor may be an integer or a rational number. In a method according to embodiments of the present invention, the magnifying factor may be different from one, e.g. larger than one.

In a method according to embodiments of the present invention, the number of the finite sequence of measurements, also referred to as the number of sampling points, may be less than dictated by the Nyquist rate.

In a method according to embodiments of the present invention, the subset of said family of functions may be a sparse subset.

In a method according to embodiments of the present invention, the common construction may be parameterized by at least one continuous parameter. In a method according to embodiments of the present invention, the common construction may be parameterized by at least one discrete parameter.

In a method according to embodiments of the present invention, the method may comprise, prior to obtaining the family of functions, applying a transformation on the data for selecting a domain corresponding to said at least one variable and a codomain corresponding to the data. Alternatively or in addition thereto, the method may comprise applying a transformation on the finite sequence of measurements after said obtaining the finite sequence of measurements.

A method according to embodiments of the present invention may further comprise determining a set of weight factors for representing the data as a linear combination of said subset.

In a method according to embodiments of the present invention, the determining of the subset may comprise solving a numerical problem obtained from said recurrence relation. The numerical problem may be an eigenvalue problem and/or a generalized eigenvalue problem. In a method according to embodiments of the present invention, the sensitivity of this numerical problem may be controlled by the selecting of the magnifying factor. Obtaining the magnifying factor may comprise selecting the magnifying factor for controlling a numerical conditioning of the characterising of the data. Obtaining the magnifying factor may alternatively or in addition thereto comprise selecting the magnifying factor for reducing the number of sampling points below less than dictated by the Nyquist rate.

In a method according to embodiments of the present invention, the finite sequence of sampling points may have a predetermined cardinality. In a method according to embodiments of the present invention, the cardinality of the finite sequence of sampling points may be imposed as a predetermined cardinality. In a method according to embodiments of the present invention, the cardinality of the finite sequence of sampling points may be probed for by evaluating a sparsity condition. Determining the cardinality, e.g. probing or imposing may be performed in an iterative manner. The predetermined cardinality also may be altered.

In a method according to embodiments of the present invention, the method may comprise performing a sparsity check by determining a numerical rank of a matrix or matrices constructed from the recurrence relation using the finite sequence of measurements.

Performing the sparsity test may be performed before or concurrently with the smart sampling.

In a method according to embodiments of the present invention, the sampling points may comprise multivariate components.

In a method according to embodiments of the present invention, the determining of the subset may comprise an inverse application of a technique based on the Chinese remainder theorem.

In a method according to embodiments of the present invention, the family of functions may comprise a basis.

In a method according to embodiments of the present invention, the common construction may comprise a complex exponential.

In a method according to embodiments of the present invention, the common construction may comprise monomials or multinomials.

A method according to embodiments of the present invention, may furthermore comprise a divide and conquer step prior to the identification of the signal. In a method according to embodiments of the present invention, the smart sampling may be performed jointly with or after the divide and conquer step.

The matrices representing the recurrence relation may be square or rectangular.

Obtaining measurements may comprise further sampling the data in a further finite sequence of sampling points in order to take into account a periodicity of the family of functions in determining a subset of the family of functions.

Further sampling the data in a further finite sequence of sampling points thereby may be such that a location of the further finite sequence of sampling points is at least also determined by a value of an identification shift for uniquely determining the elements in said subset.

A method for characterising data as described above, the steps of the method being computer-implemented.

In a second aspect, the present invention also provides a computer-program product, e.g. stored in non-transitory form on a computer-readable medium, for, when executed on a computing means, performing a method as described above. The present invention also relates to the transmission of such a computer program product over a local or a wide area network, as well as to a data carrier, e.g. a computer-readable storage device, comprising such a computer-program.

In a third aspect, the present invention provides a device, e.g. a computer-based device, for characterising data dependent on at least one variable. The device comprises a numerical processing unit adapted for obtaining, for the data to be characterised, a finite sequence of measurements of the data by sampling the data in a finite sequence of sampling points, the finite sequence of sampling points being controlled by a magnifying factor for controlling a spacing between elements in the finite sequence of sampling points and being determined such that the values of the functions of a family of functions in the finite sequence of sampling points satisfy a recurrence relation. The family of functions thereby has a domain corresponding to the at least one variable and a codomain corresponding to the data. The family of functions shares a common construction parameterized by at least one parameter. The numerical processing unit furthermore is adapted for determining a property of the data. The device furthermore may comprise an output means for outputting the property of the data, taking into account the finite sequence of measurements.

The device furthermore may comprise an input means for obtaining one or more of the data to be characterised, the family of functions or the magnifying factor. In a device according to embodiments of the present invention, this input means may comprise a sensor for gathering a plurality of measurements on a signal. A device according to embodiments of the present invention, may further comprise a memory for storing the finite sequence of measurements. In a device according to embodiments of the present invention, the numerical processing unit may be adapted for processing the finite sequence of measurements to obtain an acceptable-quality reconstruction of the signal.

In still a further aspect, the present invention relates to a method for obtaining an acceptable-quality reconstruction of data. This method comprises the steps of dividing the data into a plurality of segments, for example but not necessarily segments of substantially equal length.

In yet a further aspect, the present invention relates to a method for obtaining an acceptable-quality reconstruction of a signal comprising identifying a signal, wherein the signal is represented under a predetermined set of a plurality of functions, wherein the plurality of functions share a common construction; running the sparsity test to determine the cardinality of support t; developing a matrix structure from the common construction, wherein the dimension of the matrix is at least t×t; smart sampling the first signal to obtain a plurality of measurements; developing a data matrix with the plurality of measurements in accordance with the matrix structure; and sparse reconstructing a representative function from the data matrix.

The present invention also relates to a signal representing data, to be characterised, modelled or reconstructed, whereby the signal is obtained using a method as described above.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
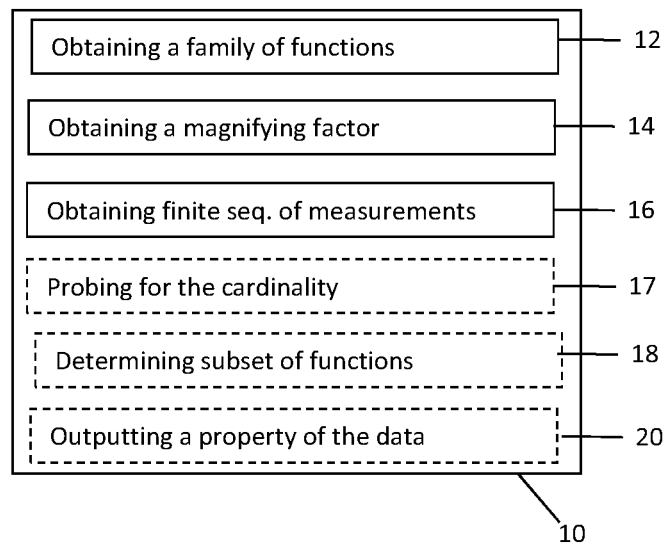
FIG. 1 illustrates an exemplary method according to embodiments of the present invention.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention is described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to functions having a domain corresponding to at least one variable, reference is made to functions associating an output with an input from the domain of the at least one variable.

Where in embodiments of the present invention reference is made to a codomain of a function, reference is made to a target set wherein the output of the function should fall.

Where in embodiments of the present invention reference is made to a family of functions, reference is made to a plurality of functions sharing a common construction, i.e. the functions in the family are instantiations of the same parameterized mathematical expression.

Where in embodiments of the present invention reference is made to numerical conditioning, reference is made to the sensitivity of the computation of the numerical result with regard to the perturbation of the input to that computation.

Where in embodiments of the present invention reference is made to a recurrence relation, reference is made to a mathematical expression wherein terms are recursively defined.

Where in embodiments according to the present invention, reference is made to data to be represented, reference may for example be made to geological data, mathematical data, chemical data, biological data, physical data such as for example signals, images or video, sound data such as voice or music data, medical images, sensor data such as bioelectrical data like EEG data, ELG data, EMG data, ECG data, EOG data, magnetic resonance imaging data, telecommunication transmission data, textual data etc. It may be time varying measurement data, control system data corresponding with control system signals that control other device or systems, . . . . The data may be a registration of a physical effect and may be referred to as physical data. The data may be intended to depict the state of an object for measurement, which may be a patient's brain as in EEG or a picture of the earth as in a seismic survey.

Where in embodiments of the present invention reference is made to sparse data, such embodiments are not only applicable to sparse data, but are equally applicable to data that can be sparsely approximated, the latter also being encompassed by the claims of the present invention. Data or a model representing these data, can be called sparse if it is advantageous to separately determine the support for the model from the measurements, rather than determine only the weights in the model as in a dense representation. Since this determining of the support requires (at least) twice as much measurements as the cardinality of the sparse support, the cardinality should not be more than half the number of basis functions necessary in a comparable dense representation. A sparse characterisation of the data may also be more precise than a dense characterisation in terms of basis elements, if the basis elements do not capture the characteristics of the data equally well, e.g. when using a discrete basis compared to a family of functions parameterized by at least one continuous parameter.

In a first aspect, the present invention relates to a computer-based method for characterising data dependent on at least one variable. Such data may be continuous data or discrete data. The method can be applicable to a vast range of applications, such as for example but not limited to biomedical signal processing, audio and video signal processing, civil engineering, telecommunication and/or tele-monitoring, high-resolution imaging, data describing physical and chemical phenomena, textual data etc. The method comprises obtaining a family of functions, e.g. $\{\phi_k : k \in K^d\}$, having a domain corresponding to the at least one variable and a codomain corresponding to the data. This family of functions shares a common construction parameterized by at least one parameter, e.g. $k \in K^d$ with d being larger than or equal to 1. The number of variables of the functions $\phi_k$ need not equal the number d of parameters, but in most of the illustrations and examples below that is the case. The method further comprises obtaining a magnifying factor, e.g. but not solely for controlling a numerical conditioning of the characterisation of the data, and obtaining a finite sequence of measurements of the data by sampling the data in a finite sequence of sampling points. This finite sequence of sampling points, e.g. $\{\xi^{(j)} : j=0, \ldots, 2t-1\}$, is determined such that the function values, e.g. $\{\phi_k(\xi^{(j)}) : k \in K^d\}$, in this finite sequence of sampling points satisfy a recurrence relation. The finite sequence of sampling points is furthermore determined such that a spacing between different sampling points is controlled at least by the magnifying factor. The method, in some embodiments, furthermore may comprise determining a subset, e.g. $\{\phi_{k^{(i)}} : i=1, \ldots, t\} \subset \{\phi_k : k \in K^d\}$, of the family of functions. Such a property of the data may be a representation of the data. This determining of the subset makes use of the recurrence relation satisfied by the finite sequence of measurements. Possibly some additional sampling is required because the periodicity of the functions, e.g. $\phi_k$, does otherwise not allow the unique identification of the subset. The method furthermore comprises outputting a property of the data, determined taking into account the finite sequence of measurements. The property of the data may be a representation of the data, e.g. $\Sigma_{i=1}^{t} \alpha_i \phi_{k^{(i)}}$.

It typically may be desirable to obtain an acceptable-quality characterisation of the signal. The term "acceptable-quality" herein refers to a level of accuracy sufficient to depict the state of the object faithfully for the selected application. Characterising data may comprise analysing the data with respect to the number and value of the dominant parameters present in the data, modelling the data, e.g. constructing a mathematical model for representing the data, and/or reconstructing the data, e.g. providing a sufficient description of the data in order to reconstruct the original data or extrapolate the original data. Such sufficient description may preferably be a concise description, e.g. a sparse representation, for example for the purpose of data compression.

Referring to FIG. 1, an exemplary method (10) for characterising data dependent on at least one variable according to embodiments of this first aspect of the present invention is shown.

The exemplary method (10) comprises obtaining (12) a family of functions, e.g. $\{\phi_k : k \in K^d\}$, having a domain corresponding to the at least one variable and a codomain corresponding to the data. In order words, each function of this family of functions projects points in the domain of the at least one variable on which the data is dependent onto points in the codomain of the data. This family of functions shares a common construction parameterized by at least one parameter, e.g. $k \in K^d$ with d equal to or larger than 1. The number of variables of the functions $\phi_k$ need not equal the number d of parameters, but in most of the illustrations and examples below that is the case. For example, this family of functions may be expressed in function of a shared mathematical expression, in which each function is identified by a specific parameter choice for each parameter in this expression. One example may be by a multivariate polynomial, another example may be by a trigonometric function. The at least one parameter may be a single scalar parameter, for example a parameter taking a complex, real, rational, integer or natural numeric value. The at least one parameter may also be a vector composed of such scalar components. The common construction may be parameterized by at least one continuous parameter, for example a parameter selectable from an uncountable parameter set, e.g. at least one real or complex numeric parameter value. Where reference is made herein to real or complex values, it is understood that in a digital implementation, e.g. an implementation in computer software, such continuous parameters may be an approximation up to a hardware or software specific limit of an underlying continuous entity, for example determined by a machine epsilon value. This common construction may also be parameterized by at least one discrete parameter, e.g. a parameter selectable from a countable parameter set. This family of functions may comprise a basis for the data domain. The common construction may comprise monomials or multinomials, wavelets, trigonometric functions or functions based thereon, etc. The common construction may comprise a complex exponential.

The method (10) further comprises obtaining (14) a magnifying factor, e.g. r, e.g. but not solely for controlling a numerical conditioning of the characterisation of the data. This magnifying factor may be a scalar, e.g. an integer or a ratio of integers. In embodiments according to the present invention this magnifying factor may be one or larger, or may be strictly larger than one. This magnifying factor may control a numerical conditioning of the characterisation of the data, e.g. the numerical conditioning of the step of determining (18) a subset of the family of functions as discussed further hereinbelow. This magnifying factor may also control a level of compression of the data and/or influence the level of accuracy of determining (18) a subset of the family of functions and determining (20) a set of weight factors for representing the data. This obtaining may comprise assigning a predetermined value to this magnifying factor, evaluating the numerical conditioning, e.g. determining a condition number of a matrix, and adjusting this value, e.g. additively or multiplicatively adjusting the magnifying factor by a predetermined or randomly selected amount. Such procedure may be iterated until a satisfactory numerical conditioning, e.g. a condition number of a matrix, or a satisfactory level of compression of the data or level of accuracy of the characterisation, below a predetermined threshold, is reached. Alternatively, a predetermined number of such magnifying factor trials may be performed, and the best case, e.g. corresponding to the lowest condition number, may be selected. This condition number may refer to a matrix involved in the step of determining (18) a subset of the family of functions, for example to a Vandermonde matrix related to the matrices involved in solving a generalized eigenvalue problem or eigenvalue problem in order to determine (18) the subset of the family of functions. The magnifying factor determines a spacing between the different sampling points.

Furthermore, the method (10) comprises obtaining (16) a finite sequence of measurements of the data by sampling the data in a finite sequence of sampling points. This finite sequence of sampling points, e.g. $\{\xi^{(j)}: j=0, \ldots, 2t-1\}$, is determined such that the function values, e.g. $\{\phi_k(\xi^{(j)}): k \in K^d\}$, in this finite sequence of sampling points satisfy a recurrence relation. Such recurrence relation may enable the determining of the subset of the family of functions, shown by step (18) in FIG. 1. The spacing between the different sampling points in the finite sequence of sampling points may furthermore at least be determined by the magnifying factor. For example, a recurrence relation may state that $\phi_k(\xi^{(j+1)}) = \phi_k(\xi^{(1)}) \phi_k(\xi^{(j)})$, for j+1>0, in which $\xi^{(1)}$ may be considered a value which may be freely adjusted, e.g. by the magnifying factor r, without invalidating the recurrence relation, e.g. from an initial value $\xi^{(1)}$ to a value $(\xi^{(1)})^r$ or $r\xi^{(1)}$.

This obtaining (16) of the finite sequence of measurements may comprise applying a suitable transformation of the data or signal to another domain and/or codomain. For example, a wavelet transform, a Fourier transform or a cosine transform or another transformation may be applied.

This finite sequence of sampling points may have a predetermined cardinality, e.g. 2t. For example, the number of sampling points may be known a priori, e.g. determined by prior knowledge about the data to be characterised and/or known properties of the family of functions. The cardinality of the finite sequence of sampling points may be iteratively increased in order to impose a satisfactory predetermined cardinality. For example, first two measurements corresponding to first two sampling points may be obtained (16) and a first function from the family of functions may be determined (18) for these first two sampling points, then a second two measurements may be obtained (16) corresponding to second two sampling points, and a subset of the family of functions may be determined (18) jointly for the first two and second two measurements, and so on until a predetermined number of sampling points has been reached. Such procedure may result in a sequence of subsets not necessarily being subsets of each other—of increasing size, which may be used in combination to characterise the data in combination, or by selection of an optimal subset from this sequence, e.g. by evaluating a goodness of fit or other quality measure. Furthermore, the cardinality of the finite sequence of sampling points may be iteratively determined by evaluating a sparsity condition. For example, a sequence of subsets may be evaluated for increasing or decreasing sizes, in which a sparsity condition determines a stopping point for this sequence. For example, such sparsity condition may comprise a numerical rank of a matrix representing for example an eigenvalue problem and/or generalized eigenvalue problem which is solved for determining (18) the subset. The cardinality thus may be predetermined, probed for or imposed, and probing for or imposing may be performed in an iterative manner. By way of illustration, embodiments of the present invention not being limited thereto, the optional step of probing for the cardinality is shown in FIG. 1 by step (17). Depending on the way the cardinality is introduced, a corresponding step can be performed before selecting a magnifying factor (indicated as step (14) in FIG. 1), iteratively, or at a different moment during the procedure.

The method, in one embodiment, also may be adapted for monitoring a change and for adjusting the cardinality as function thereof.

Remember that the steps of selecting a magnifying factor and obtaining measurements may be performed iteratively. Advantageously, the number of sampling points may be less than the Nyquist rate for the data to be characterised, e.g. in order to provide a sparse characterisation of the data. The sampling points, e.g. $\xi^{(j)}$, may be univariate sampling points, or may comprise multivariate components, e.g. $\xi_i^{(j)}$.

The method (10) furthermore comprises determining (18) a subset, e.g. $\{\phi_{k^{(i)}}: i=1, \ldots, t\} \subset \{\phi_k : k \in K^d\}$, of the family of functions for providing a representation of the data. In embodiments of the present invention, this subset may be a sparse subset of the family of functions, e.g. may comprise a small fraction of the total number of functions, e.g. may comprise only a fraction of the number of functions necessary to provide a basis of the space spanned by the family of functions. The subset may form a mathematical support for constructing a linear model suitable for representing the data.

This determining (18) of the subset makes use of the recurrence relation satisfied by the finite sequence of measurements. For example, the recurrence relation may enable the determination of the subset $\{\phi_{k^{(i)}}: i=1, \ldots, t\}$ by means of an eigenvalue problem or generalized eigenvalue problem constructed by means of this recurrence relation. For example, eigenvalues may be determined for a problem of the form $Av=\lambda Bv$, in which the entries in the t×t matrices A and B are composed with the 2t finite sequence of measurements.

The determining (18) of the subset may comprise applying an inverse application of a technique based on the Chinese remainder theorem. For example, components of multivariate sampling points may be chosen such that components of the parameter characterising the subset elements may be determined taking into account a relative prime relationship of these components in a solution of the eigenvalue problem and/or generalized eigenvalue problem. For example, eigenvalues may be determined and each of these eigenvalues may be factored into prime components corresponding to the parameters of the subset components.

The sensitivity of the eigenvalue problem and/or generalized eigenvalue problem may be controlled by the selection of the magnifying factor. Obtaining (16) measurements may furthermore comprise sampling the data in a further finite sequence of sampling points in order to take into account a periodicity of the family of functions in determining (18) a subset of said family of functions. For example, the family of functions may be a family of sinusoid or complex exponential functions, and a further finite sequence of sampling points may be acquired in order to uniquely determine the parameters identifying the subset. This additional finite sequence of sample points may be governed by some shift, e.g. ρ, sometimes referred to as identification shift and introduced further below.

The method (10) may furthermore comprise the step of outputting a property of the data, which may be a representation. In one example, determining a representation may for example comprise determining (20) a set of weight factors, e.g. $\{\alpha_i: i=1, \ldots, t\}$, for representing the data as a combination of the determined subset, for example as a linear combination, e.g. $\Sigma_{i=1}^{t} \alpha_i \phi_{k^{(i)}}$, of the elements in said subset.

In a second aspect, embodiments of the present invention also relate to computer-implemented methods for performing at least part of the methods for characterising data.

Embodiments of the present invention also relate to corresponding computer program products. The methods may be implemented in a computing system. They may be implemented as software, as hardware or firmware, as embedded system or as a combination thereof. Such methods may be adapted for being performed on computer in an automated and/or automatic way. In case of implementation or partly implementation as software, such software may be adapted to run on a suitable computer or computer platform, based on one or more processors. The software may be adapted for use with any suitable operating system such as for example a Windows operating system, Mac operating system or Unix-based operating system. The computing means may comprise a processing means or processor for processing data. According to some embodiments, the processing means or processor may be adapted for characterising data according to any of the methods as described above. Besides a processor, the computing system furthermore may comprise a memory system including for example ROM or RAM, an output system such as for example a CD, DVD or Blu-ray drive or means for outputting information over a network. Conventional computer components such as for example a keyboard, display, pointing device, input and output ports, etc. also may be included. Data transport may be provided based on data busses. The memory of the computing system may comprise a set of instructions, which, when implemented on the computing system, result in implementation of part or all of the standard steps of the methods as set out above and optionally of the optional steps as set out above. The obtained results may be outputted through an output means such as for example a plotter, printer, display or as output data in electronic format, embodiments of the present invention not being limited thereto.

Further aspects of embodiments of the present invention encompass computer program products embodied in a carrier medium carrying machine readable code for execution on a computing device, the computer program products as such as well as the data carrier such as CD-ROM, DVD, Blu-ray or memory device. Aspects of embodiments furthermore encompass the transmitting of a computer program product over a network, such as for example a local network or a wide area network, as well as the transmission signals corresponding therewith. The present invention thus also relates to a computer-program product, e.g. stored in non-transitory form on a computer-readable medium, for, which executed on a computing means, performing a method according to the first aspect of the present invention.

Figure 2:
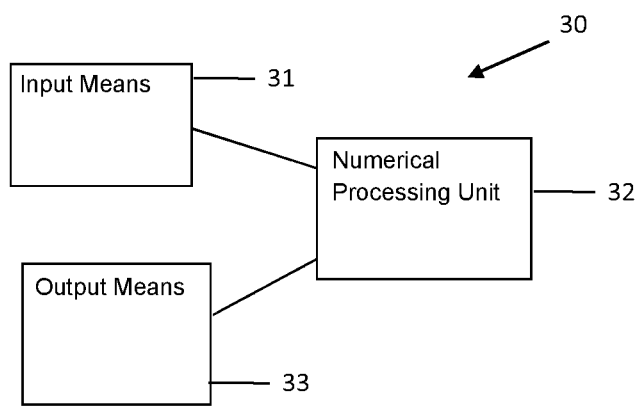
FIG. 2 schematically shows a device according to embodiments of the present invention.

In a third aspect, the present invention relates to a device (30) for characterising data dependent on at least one variable. Referring to FIG. 2, such a device (30) comprises a numerical processing unit (32) adapted for obtaining, for the data to be characterised, a finite sequence of measurements of the data by sampling the data in a finite sequence of sampling points. This finite sequence of sampling points is controlled by a magnifying factor for controlling a spacing between elements in the finite sequence of sampling points and being determined such that the values of the functions of a family of functions in the finite sequence of sampling points satisfy a recurrence relation. As indicated, a spacing of the different sampling points of said finite sequence of sampling points is controlled at least by a magnifying factor r. Additional sampling may occur, governed by a shift value ρ, for unique determination of the subset of the family of functions. This family of functions have a domain corresponding to the at least one variable and a codomain corresponding to the data. The family of functions furthermore share a common construction parameterized by at least one parameter.

The numerical processing unit (32) furthermore is adapted for determining a property of the data. The numerical processing unit may further be adapted for determining a subset, e.g. a sparse subset, of the family of functions, for representing the data, e.g. in which this subset provides a support for the representation of the data. This determining may make use of the recurrence relation satisfied by the finite sequence of measurements.

The device also comprises an output means (33) for outputting a property of the data.

The device furthermore may comprise an input means (31) for obtaining one or more of the data to be characterised, the family of functions or the magnifying factor.

A device according to embodiments of the third aspect of the present invention may comprise hardware components, e.g. semiconductor integrated circuitry, and software components, e.g. instructions adapted for executing on a program logic unit in such semiconductor integrated circuitry, for performing methods according to the first aspect of the present invention. Alternatively such a device also may be implemented as software, e.g. making use of predetermined algorithms or neural networks. The device may furthermore comprise components adapted for performing the functionality of one or more method steps or features as described in the first aspect.

In still another aspect, the present invention also relates to data, or a signal representing data, to be characterised, modelled or reconstructed, whereby the data and/or the signal are obtained using a method according to embodiments of the present invention.

By way of illustration, embodiments of the present invention not being limited thereto, theoretical principles of embodiments of the present invention as well as detailed examples are elucidated further hereinbelow. These theoretical principles and considerations are not intended to limit the present invention in any way, and are merely included in order to clarify working principles of the present invention.

Theoretical considerations that may be used are illustrated below. The following setting may for example be used.

Consider a (multi)parameterized vector $\phi_k$ with the d-dimensional parameter k belonging to $K^d$ where $K \subset \mathbb{C}$ and K is bounded. In theory $\phi_k$ can belong to an infinite dimensional vector space and K can be an infinite set. In practice $\phi_k$ may be a finite dimensional vector and K may be a (possibly very large but) finite set. We assume that the set $\Phi(K^d) := \{\phi_k : k \in K^d\}$ contains at least one basis of the vector space. We assume that the elements k of K can be ordered in some way. We are either interested in vectors $\phi_k$ that are discretized versions of (multi)parameterized functions, such as $(\cos(k\xi^{(0)}), \ldots, \cos(k\xi^{(n)})$ with d=1, $k \in K$, or directly in their continuous counterparts, here $\cos(kx)$. For simplicity, we denote both vectors by the continuous counterpart, here $\cos(kx)$. The number of variables need not equal the number d of parameters, but in this illustration it does. To explicit the dependence of $\phi_k$ on the discrete instantiations $\xi^{(j)}$ for x or $(\xi_1^{(j)}, \ldots, \xi_d^{(j)})$ for $(x_1, \ldots, x_d)$, we may also write $\phi_k(x)$ or $\phi_k(x_1, \ldots, x_d)$ respectively.

Examples where a 1-dimensional parameter d (d=1) is used are:
  $K=\{0, 1, 2, \ldots, M-1\}$, a finite subset of the natural numbers, and the monomials $\phi_k(x)=x^k$,
  $K \subset \{k \in \mathbb{R} : |k|<M\}$, a bounded subset of real numbers, and the vectors $\phi_k(x)=\exp(Ikx)$,
  $K \subset \{k \in \mathbb{C} : |\Re(k)|<M\}$, a finite bounded subset of complex numbers, and $\phi_k(x)=\cos(kx)$.

Examples where a more-dimensional parameter d (d>1) is used are:
  $K=\{0, 1, 2, \ldots, M-1\}$, $K^d=\{(k_1, \ldots, k_d) : k_i \in K, i=1, \ldots, d\}$ and the multinomials $\phi_{k_1, \ldots, k_d}(x_1, \ldots, x_d)=x_1^{k_1} \times \ldots \times x_d^{k_d}$,
  $K \subset \{k \in \mathbb{R} : |k|<M\}$, $K^d=\{(k_1, \ldots, k_d) : k_i \in K, i=1, \ldots, d\}$ and the vectors $\phi_{k_1, \ldots, k_d}(x_1, \ldots, x_d)=\exp(I(k_1x_1 + \ldots + k_dx_d))$,
  $K \subset \{k \in \mathbb{C} : |\Re(k)|<M\}$, $K^d=\{(k_1, \ldots, k_d) : k_i \in K, i=1, \ldots, d\}$ and the multivariate $\phi_{k_1, \ldots, k_d}(x_1, \ldots, x_d)=\cos(k_1x_1) \times \ldots \times \cos(k_dx_d)$.

Unless otherwise stated all coefficients in the subsequent linear combinations may be or are complex numbers. Now assume that the data vector f can be represented sufficiently well by the sparse representation shown in equation [1], $$f \approx \Sigma_{i=1}^t \alpha_i \phi_{k^{(i)}}, \quad k^{(i)}=(k_1^{(i)}, \ldots, k_d^{(i)}), \qquad [1]$$

where the number t is small compared to the dimension $\kappa$ of the subspace spanned by $\Phi(K^d)$. Traditionally, using dense approximation or interpolation methods, $\kappa$ samples are required where $\kappa=\dim(\mathrm{span}\Phi(K^d))$, because the problem is approached as $f \approx \Sigma_{i=1}^\kappa \alpha_i \phi_{e_i}$, where $\{\phi_{e_i} : 1 \leq i \leq \kappa\}$ is a basis for $\mathrm{span}\Phi(K^d)$. Then it may happen that a lot of (numerically) zero coefficients $\alpha_i$, $e_i \notin \{k^{(1)}, \ldots, k^{(t)}\}$ are unnecessarily computed. In sparse methods, the parameter vectors $k^{(i)}$ are determined separately from the coefficients $\alpha_i$, and the joint computation of the $k^{(i)}$ and the $\alpha_i$ requires only 2t samples instead of $\kappa$ samples. Remember that $t \ll \kappa$.

Furthermore, we deal with functions $\phi_k$ with $k \in K^d$ that satisfy a property of the following kind. The vectors $\phi_k$ are such that a finite sequence of samples $\{\phi_k(\xi^{(j)})\}_{j=0, 1, \ldots, 2t-1}$ exists that allows for the support $\{k^{(1)}, \ldots, k^{(t)}\}$ in the linear combination representing f, to be characterized from a t×t generalized eigenvalue problem shown in equation [2]

$$Av=\lambda Bv, \qquad [2]$$

where the entries in the t×t matrices A and B are composed with the 2t samples $\{f(\xi^{(j)})\}_{j=0, 1, \ldots, 2t-1}$ of f. These sample points $\xi^{(j)}$ may be referred to as smart sample points. In the sequel of our description, the above construction may everywhere be replaced by somewhat larger T×t rectangular matrices A and B with T>t and involving somewhat more sample vectors $\{\phi_k(\xi^{(j)})\}_{j=0, 1, \ldots, 2t+(T-t)-1}, \ldots$ without departing from the invention. The numerical linear algebra problems are then solved in some best approximation sense instead of exactly.

Examples of sets $\Phi(K^d)$ satisfying this property are, for instance:
  d=1, $K=\{0, 1, 2, \ldots, M-1\}$, $\phi_k(x)=x^k$, $\xi^{(j)}=\exp(I2\pi j/M)$, $j=0, \ldots, 2t-1$, which is further detailed and generalized to d>1 hereinbelow; from the fact that $\phi_k(\xi^{(j+1)})=\phi_k(\xi^{(1)})\phi_k(\xi^{(j)})$ the values $\phi_k(\xi^{(1)})$, and hence the parameter k, can be computed separately from a generalized eigenvalue problem as in equation [2]; d=1, $K \subset \{k \in \mathbb{C} : |\Re(k)|<M/2\}$, $\phi_k(x)=\cos(kx)$, $\xi^{(j)}=2\pi j/M$, $j=0, \ldots, 2t-1$, which is further described hereinbelow; here the recurrence $\phi_k(\xi^{(j+1)})+\phi_k(\xi^{(j-1)})=2\phi_k(\xi^{(1)})\phi_k(\xi^{(j)})$ allows the separate computation of $\phi_k(\xi^{(1)})$, and consequently of the parameter k, from a generalized eigenvalue problem as in equation [2].

Since 2t samples of f determine $2t^2$ matrix entries, the matrices A and B are bound to be structured in one way or another. The specific structure reflects the recurrence satisfied by the (multi)parameterized elements $\phi_k$ in combination with their evaluation at the particular sample points $\xi^{(j)}$.

Because of the crucial role played by the sample locations and because of the specific structure of the matrices A and B reflecting the recurrence relation satisfied by the $\phi_k$, the conditioning of the subsequent generalized eigenvalue problem (for the computation of the support $k^{(i)}$) and the subsequent linear interpolation problem (for the computation of the coefficients $\alpha_i$) is dominated by the conditioning of the Vandermonde matrix composed with the smart samples. This is made clear further hereinbelow.

The following are simple illustrations of the situation. The first example illustrating the use of multivariate polynomials is of use in the audio signal processing and transient detection application that will be given as illustrations further in this description. The second example illustrating the use of trigonometric functions is of use in the biomedical signal application that will be given as illustration further in the description.

The first example illustrates the use of multivariate polynomials. Let $k^{(i)}$ be the multi-index $k^{(i)}=(k_1^{(i)}, \ldots, k_d^{(i)})$ and let $\phi_{k^{(i)}}$ be the multinomial $$\phi_{k^{(i)}}(x_1, \ldots, x_d) = x_1^{k_1^{(i)}} \times \ldots \times x_d^{k_d^{(i)}}.$$

A possible order of the d-dimensional multi-indices is for instance $(0, \ldots, 0)$, $(1, 0, \ldots, 0)$, $\ldots$, $(0, \ldots, 0, 1)$, $(2, 0, \ldots, 0)$, $\ldots$ and so on. Let us identify, up to an acceptable error, f with the sparse polynomial $f(x_1, \ldots, x_d)=\Sigma_{i=1}^{t}\alpha_i\phi_{k^{(i)}}(x_1, \ldots, x_d)$. We collect the values of f at points $(x_1, \ldots, x_d)=(\xi_1^s, \ldots, \xi_d^s)$ which are the s-th powers of some suitably chosen $(\xi_1, \ldots, \xi_d)$: $f_s=f(\xi^{(s)})=f(\xi_1^s, \ldots, \xi_d^s)$, $s=0, 1, 2, \ldots$.

With the values $f_s$ we fill the Hankel matrices $$H_t^{(u)} = \begin{pmatrix} f_u & \cdots & f_{u+t-1} \\ \vdots & & f_{u+t} \\ & & \vdots \\ f_{u+t-1} & \cdots & f_{u+2t-2} \end{pmatrix}, u=0, 1.$$

Then the support $\{k^{(1)}, \ldots, k^{(t)}\}$ of the polynomial f is uniquely obtained from the generalized eigenvalues $\lambda_1, \ldots, \lambda_t$ satisfying equation [3]

$$H_t^{(1)}v_i = \lambda_i H_t^{(0)}v_i, i=1, \ldots, t, \qquad [3]$$

if the sample point $(\xi_1, \ldots, \xi_d)$ is chosen appropriately. For instance, if the mutually prime numbers $p_i$ bound in a strict sense the partial degree of f in the variable $x_i$, then with $m=p_1 \times \ldots \times p_d$, $\omega=\exp(12\pi/m)$, $\xi_i=\omega^{(m/p_i)}$, $i=1, \ldots, d$, the generalized eigenvalues are of the form $\lambda_i=\omega^{\kappa_i}$ where $$\kappa_i = k_1^{(i)}\frac{m}{p_1} + \ldots + k_d^{(i)}\frac{m}{p_d}, i=1, \ldots, t.$$

The roots of unity of relatively prime order possess the property that $\xi_i^{p_i}=1$, $\xi_i^j \neq 1$, $1 \leq j < p_i$. Hence the individual $k_1^{(i)}, \ldots, k_d^{(i)}$ can be retrieved from a reverse application of the Chinese remainder theorem. The structured generalized eigenvalue problem expresses the relation between the multinomials $\phi_{k^{(1)}}, \ldots, \phi_{k^{(t)}}$ and the sample point coordinates $\xi_i^0, \xi_i^1, \xi_i^2, \ldots$. With $\Phi_{i,s}=\phi_{k^{(i)}}(\xi_1^s, \ldots, \xi_d^s)$, $\Lambda=\text{diag}(\Phi_{1,1}, \ldots, \Phi_{t,1})$, $D=\text{diag}(\alpha_1, \ldots, \alpha_t)$ and $$W = \begin{pmatrix} 1 & 1 & \cdots & 1 \\ \Phi_{1,1} & \Phi_{2,1} & \cdots & \Phi_{t,1} \\ \vdots & \vdots & \ddots & \vdots \\ \Phi_{1,t-1} & \Phi_{2,t-1} & \cdots & \Phi_{t,t-1} \end{pmatrix},$$

we have $H_t^{(0)}=WDW^T$, $H_t^{(1)}=W\Lambda DW^T$ and hence $H_t^{(1)}v_i=\Phi_{i,1}H_t^{(0)}v_i$, $i=1, \ldots, t$. For the $\phi_{k^{(i)}}$ and the $\xi_i^s$ under consideration, we further have $\Phi_{i,s}=\Phi_{i,1}^s=\omega^{s\kappa_i}$ so that W is actually a Vandermonde matrix constructed with the $\Phi_{i,1}=\Phi^{\kappa_i}$. Finally, the coefficients $\alpha_i$ in the sparse representation $f(x_1, \ldots, x_d)=\Sigma_{i=1}^{t}\alpha_i\phi_{k^{(i)}}(x_1, \ldots, x_d)$ are determined from the interpolation problem $\Sigma_{i=1}^{t}\alpha_i\phi_{k^{(i)}}(\xi_1^s, \ldots, \xi_d^s)=f_s$, $s=j, \ldots, j+t-1$, where the $k^{(1)}, \ldots, k^{(t)}$ are known now and j is any index between 0 and t. One can show that $H_t^{(0)}$ and $H_t^{(1)}$ are regular. Furtherdown, we develop a sparsity test which reveals the cardinality t of the sparse support, should it not be known or given in advance.

The second example illustrates the use of trigonometric functions, which may for example find application in signal processing. Suppose $$f(x)=\Sigma_{i=1}^{t_c}\alpha_{i,c}\cos(\gamma_i x)+\Sigma_{i=1}^{t_s}\alpha_{i,s}\sin(\sigma_i x), x\in[-\pi,\pi] \qquad [4]$$

Then $f(x)+f(-x)$ is an even function containing only the cosine terms and $f(x)-f(-x)$ is an odd function containing only the sine terms. Since every sine term in the odd part of the function can be replaced by a shifted cosine term of the form $\cos(\sigma_i x-\pi/2)$, it suffices to deal with the sparse cosine interpolation of $f(x)=\Sigma_{i=1}^{t}\alpha_i\cos(k^{(i)}x)$, where the phase shift is absorbed in the coefficient. The reason for the latter is that for $f(x)=\Sigma_{i=1}^{t}\alpha_i\cos(\gamma_i x+\delta_i)=\Sigma_{i=1}^{t}(\alpha_i\cos\delta_i)\cos(\gamma_i x)-\Sigma_{i=1}^{t}(\alpha_i\sin\delta_i)\sin(\gamma_i x)$, we have $(f(x)+f(-x))/2=\Sigma_{i=1}^{t}(\alpha_i\cos\delta_i)\cos(\gamma_i x)$.

Traditionally the values $k^{(i)}$ are discrete multiples, even integer multiples of $2\pi$. We relax this to include complex $k^{(i)}$. If the frequencies $k^{(i)}$ are ordered such that $0 \leq \Re(k^{(1)}) < \Re(k^{(2)}) < \ldots < \Re(k^{(t)}) < M/2$, then a uniform sampling rate of at least M is required for an aliasing-free reconstruction. Choose $\omega=2\pi/M$, evaluate $f_s=f(s\omega)$, $s=\ldots, -2, -1, 0, 1, 2, \ldots$ and fill the Hankel-plus-Toeplitz matrices $$A_t^{(s,>)} = \begin{pmatrix} 2f_s & f_{s+1}+f_{s-1} & \cdots & f_{s+t-1}+f_{s-t+1} \\ 2f_{s+1} & f_{s+2}+f_s & \cdots & f_{s+t}+f_{s-t+2} \\ \vdots & \vdots & \ddots & \vdots \\ 2f_{s+t-1} & f_{s+t}+f_{s+t-2} & \cdots & f_{s+2t-2}+f_s \end{pmatrix},$$

$$A_t^{(s,<)} = \begin{pmatrix} 2f_s & f_{s+1}+f_{s-1} & \cdots & f_{s+t-1}+f_{s-t+1} \\ 2f_{s-1} & f_s+f_{s-t} & \cdots & f_{s+t-2}+f_{s-t} \\ \vdots & \vdots & \ddots & \vdots \\ 2f_{s-t+1} & f_{s-t+2}+f_{s-t} & \cdots & f_s+f_{s-2t+2} \end{pmatrix},$$

and $$B_t^{(s)} = \frac{1}{4}(A_t^{(s,<)} + A_t^{(s,>)}).$$

With $\Phi_{i,s}=\cos(k^{(i)}s\omega)$, $\Lambda_s=\text{diag}(\Phi_{1,s}, \ldots, \Phi_{t,s})$, $D=\text{diag}(\alpha_i, \ldots, \alpha_t)$ and $$W = \begin{pmatrix} 1 & 1 & \cdots & 1 \\ \Phi_{1,1} & \Phi_{2,1} & \cdots & \Phi_{t,1} \\ \vdots & \vdots & \ddots & \vdots \\ \Phi_{1,t-1} & \Phi_{2,t-1} & \cdots & \Phi_{t,t-1} \end{pmatrix},$$

we have $B_t^{(s)} = W \Lambda_s D W^T$ and hence the $\Phi_{i,1}$ are obtained from the generalized eigenvalue problem $$(B_t^{(s)} + B_t^{(s-2)}) v_i = 2\Phi_{i,s} B_t^{(s-1)} v_i, \quad i=1,\ldots,t, \quad [5]$$

with s=1. For the cosine functions $\phi_{k_i} = \cos(k^{(i)}x)$ and the sample locations $x = \xi^{(s)} = s\omega$ we further have $$W = L \begin{pmatrix} 1 & \cdots & 1 \\ \Phi_{1,1} & \cdots & \Phi_{t,1} \\ \vdots & \ddots & \vdots \\ \Phi_{1,1}^{t-1} & \cdots & \Phi_{t,1}^{t-1} \end{pmatrix}$$

where L is a t×t lower triangular matrix with diagonal entries (1, 1, 2, . . . , $2^{t-2}$). So again a Vandermonde matrix, now composed with the $\Phi_{i,1} = \cos(k^{(i)}\omega)$, is involved in the generalized eigenvalue problem. When $\Re (k^{(i)}) < M/2$, then we have $\Re (k^{(i)})\omega < \pi$ and hence $k^{(i)}$ is uniquely determined by the eigenvalue $\cos(k^{(i)}\omega)$. Further hereinbelow we explain how to deal with the situation where different frequencies $k^{(i)}$ and another choice for $\omega$ give rise to the same eigenvalue $\cos(k^{(i)}\omega)$.

Finally the coefficients $\alpha_1, \ldots, \alpha_t$ are determined from the interpolation problem $$\Sigma_{i=1}^t \alpha_i \cos(k^{(i)}s\omega) = f_s, \quad s=j,\ldots,j+t-1,$$

where again the index j takes any value between 0 and t. By virtue of the fact that the (complex) frequencies $k^{(i)}$ are fixed by the generalized eigenvalue problem stemming from the 2t interpolation conditions, t interpolation conditions are obtained for free.

Before we further discuss examples of the smart distribution of the sample points, we illustrate how a shift in the basis functions, from $\phi_k(x_1,\ldots,x_d)$ to $\phi_k(x_1+s_1,\ldots,x_d+s_d)$ in the multinomial case, or from $\cos(\gamma_i x)$ and $\sin(\alpha_i x)$ to $\cos(\gamma_i x + \delta_i)$ and $\sin(\alpha_i x + \tau_i)$ sometimes can be of use.

The object f may enjoy a sparse representation in one basis and a non-sparse representation in another one. For instance, the expression $1+(x+2)^{100}$ is sparse in the shifted basis $\phi_k(x) = (x+2)^k$, k≥0 while it is non-sparse in the basis $\phi_k(x) = x^k$, k≥0. Finding a sparse shift may be a useful preprocessing step in the reconstruction of f.

In the polynomial case, it is known that for any two representations of a univariate polynomial of degree $\kappa-1$ in two shifted power bases, respectively with $t_1$ and $t_2$ terms, it holds that $$t_1 + t_2 > \kappa. \quad [6]$$

This implies that if either $t_1$ or $t_2$ are less than or equal to $\kappa/2$, then that representation is the unique sparsest one, because it is impossible for another equally sparse or sparser representation to satisfy $t_1 + t_2 > \kappa$. Similarly, when the $\phi_k$ are a finite number of vectors arranged in a matrix $C=(\phi_1, \phi_2, \ldots)$, then a representation as a linear combination of the $\phi_k$ is unique if it is built with less than spark(C)/2 elements. Here spark(C) is the smallest number of linearly dependent columns of C.

In addition, we already know how to deal with phase shifts in a signal $f(x) = \Sigma_{i=1}^t \alpha_i \cos(\gamma_i x + \delta_i)$. From the sum rules in trigonometry we obtain $$f_+(x) = \frac{f(x) + f(-x)}{2} = \sum_{i=1}^t \alpha_i \cos\delta_i \cos(\gamma_i x),$$

$$f_-(x) = \frac{f(x) - f(-x)}{2} = -\sum_{i=1}^t \alpha_i \sin\delta_i \sin(\gamma_i x),$$

$$f(x) = f_+(x) + f_-(x).$$

The frequencies $\gamma_i$ can be determined from $f_+(x)$ and therefore no more than 2t samples are required from $f_+(x)$ or, in other words, 4t samples of f. The coefficients and phase shifts are determined from the linear interpolation of $f_+(x)$ and $f_-(x)$ using the same 4t samples.

In the following, some principles that can be used in embodiments of the present invention are illustrated, such working principles not being intended to limit the present invention in any way. Steps for computing the cardinality of the unknown support and weight coefficients are now discussed. The following principles illustrate an example of how sampling may be determined.

In the sparse representation indicated above there are in total 2t+1 unknowns: the number of terms t itself, the support $\{k^{(1)}, \ldots, k^{(t)}\}$ and the nonzero coefficients $\alpha_1, \ldots, \alpha_t$. As outlined before, we consider the choice of the set of vectors $\Phi(K^d)$ fixed a priori and fully determined by the nature of the phenomenon that we are modelling.

We now discuss an example of the computation of the 2t+1 unknowns. The complexity of all algorithmic steps is given below. We also describe how the so-called smart sampling of f at the same time can control the conditioning of the numerical processes. The conditioning is further controlled as indicated further below, where a technique is given to chop up a sparse modelling problem of size t in problems of smaller size. By a combination of the methods described, the widespread belief that the sparse representation techniques from coding theory cannot be carried to a noisy numeric environment can be countered.

In brief, a reconstruction of f from a minimal or small number of samples can be computed following the different steps outlined and summarized below, discussed in more detail further in the description:

1. Samples of f are, for instance, collected at powers of $\exp(2\pi I/m)$ or multiples of $2\pi/M$ with m and M as described above. The primitive roots of unity and their properties can advantageously be used in the theory, especially when introducing a magnifying factor.

2. If the process is one of reconstructing an exact sparse representation of f, then the value of t is revealed during the collection of the samples, as will be shown below. If the process is one of approximating f by a sparse model of the form expressed by equation [1], then t is determined by the user in function of the required accuracy.

3. With 2t samples at our disposal, we compute the support $\{k^{(1)}, \ldots, k^{(t)}\} \subset K^d$ by expressing the relationship between consecutive sampled elements $\phi_k(\xi^{(s)})$ for s=0, 1, ..., such as a multiplicative rule or a 3-term recurrence relation. This relationship gives rise to a generalized eigenvalue problem as illustrated above. Possibly some additional sampling is required because the periodicity of the functions $\phi_k$ does otherwise not allow the unique identification of the subset $\{k^{(1)}, \ldots, k^{(t)}\} \subset K^d$.

4. After the support is known, the coefficients $\alpha_1, \ldots, \alpha_t$ in the model expressed by equation [1] are obtained from a subset of t interpolation conditions. Because of fixing the support in the generalized eigenvalue problem, an additional t interpolation conditions are satisfied automatically.

In a first step, an illustration of how sampling could be handled is discussed, embodiments of the present invention not being limited thereto. The sensitivity of the generalized eigenvalue problem $Av=\lambda Bv$ is measured in the condition number $\text{cond}(\lambda, B^{-1}A)$ which is bounded above for all $\lambda$ by the condition number of the matrix whose columns are the right eigenvectors. From the matrix factorizations for A and B we see, for instance, that both in the polynomial and the trigonometric example the right eigenvectors are the columns of $W^T$. Hence the conditioning of the generalized eigenvalue problem is dominated by $\text{cond}(W)=\|W^{-1}\|\cdot\|W\|$. Because of the relationship between W and the Vandermonde matrix V constructed with the nodes $\Phi_{i,1}$, the value $\text{cond}(W)$ is mostly determined by $\text{cond}(V)$.

In general, Vandermonde matrices can be poorly conditioned. But when the nodes making up the matrix are in some way evenly distributed the conditioning is optimal. Even less uniform sequences of nodes may lead to small condition numbers of Vandermonde matrices. So in the sparse models discussed above, the possibility exists to work with well-conditioned matrices. We now detail how to control this conditioning during the sampling of f. We can select the location of the sample points in function of the conditioning, while maintaining the recurrence relation satisfied by the $\phi_k(\xi^{(j)})$ expressed above by in equations [3] and [5]. These locations could be referred to as smart locations.

We recall that $$\|V\|_\infty = \max_{1\leq j\leq t} \sum_{i=1}^{t} |\Phi_{i,1}^{j-1}|$$

and that the norm of the inverse Vandermonde matrix is bounded by $$\|V^{-1}\|_\infty \leq \max_{1\leq j\leq t} \prod_{i=1, i\neq j}^{t} \frac{1+|\Phi_{i,1}|}{|\Phi_{i,1}-\Phi_{j,1}|}.$$

We now take a closer look at $\Phi_{i,1}=\omega^{\kappa_i}$ in the multinomial case and $\Phi_{i,1}=\cos(k^{(i)}\omega)$ in the cosine case. In both cases $\omega$ is related to a primitive root of unity. It is the argument of or it is itself the primitive root of unity: $\omega=2\pi/M$ or $\omega=\exp(2\pi I/m)$.

Let us start with the multivariate polynomial example. With the $\Phi_{i,1}^{j-1}$ in the closed unit disk, the norm of the Vandermonde matrix is bounded by $$\|V\|_\infty \leq t,$$

and the norm of the inverse Vandermonde matrix is bounded by $$\|V^{-1}\|_\infty \leq \max_{1\leq j\leq t} \frac{2^{t-1}}{\prod_{i=1, i\neq j}^{t} |\Phi_{i,1}-\Phi_{j,1}|},$$

with equality for the latter if (but not only if) all $\Phi_{i,1}$ lie on a single ray originating from the origin. So clearly, the distribution of the $\Phi_{i,1}$ affects the conditioning. The optimal conditioning of V is achieved when the $\Phi_{i,1}$ are evenly distributed on the unit circle or in the interval $[-1,1]$. In the multinomial case we write $\Phi_{i,1}-\Phi_{j,1}=\omega^{\kappa_i}-\omega^{\kappa_j}$ and $\Delta_{ij}=|\kappa_i-\kappa_j|$ with $\kappa_j, \kappa_j \in \mathbb{N}$ and hence $$|\Phi_{i,1}-\Phi_{j,1}|=\sqrt{2-2\cos(2\pi\Delta_{ij}/m)}.$$

Figure 3:
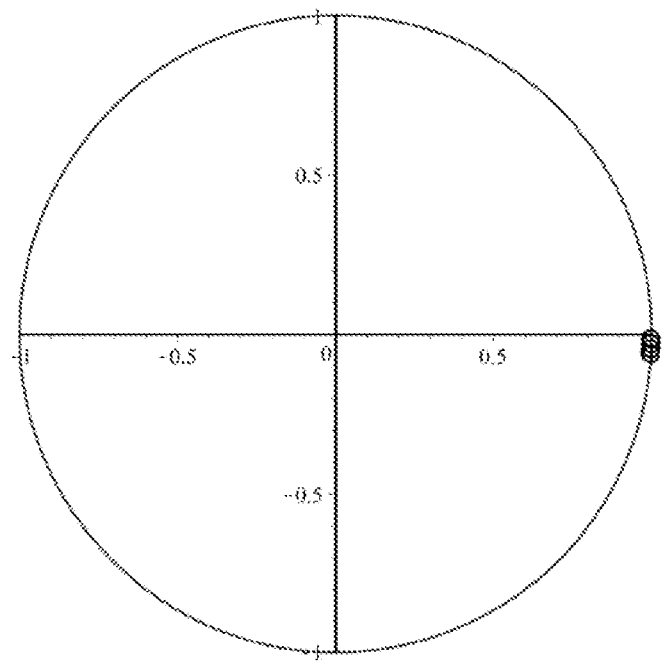
FIG. 3 shows a clustering of eigenvalues on the unit-circle, as can occur in an example according to an embodiment of the present invention.
Figure 4:
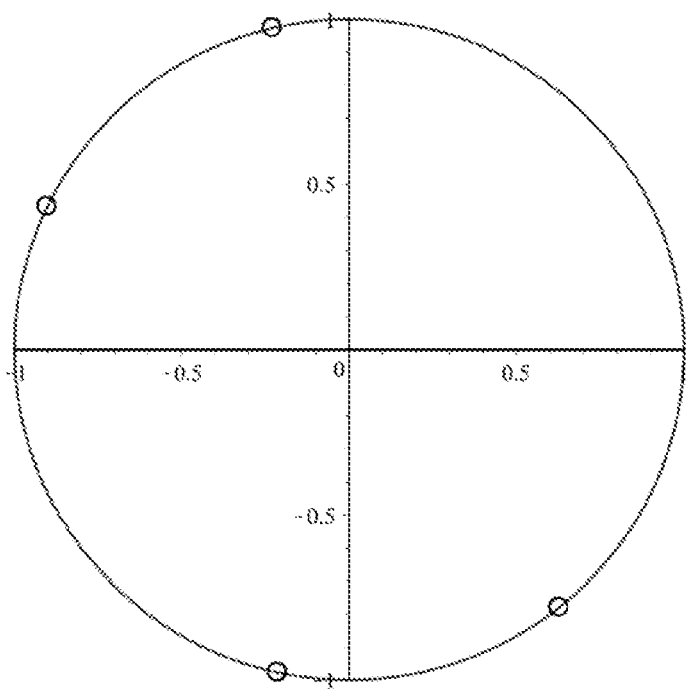
FIG. 4 and FIG. 5 show a relocation of eigenvalues on the unit-circle, as can be obtained in an example according to an embodiment of the present invention.
Figure 5:
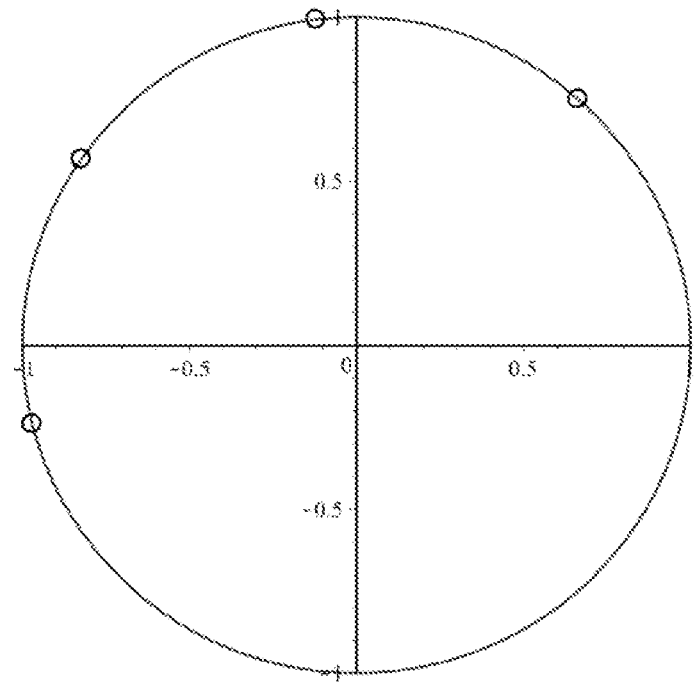

Because all $\Phi_{i,1}$ lie on the unit circle, we have $1\leq\Delta_{ij}\leq$floor$(m/2)$. The worst conditioning of V happens when all $\Delta_{i,i+1}=1$ and the $\omega^{\kappa_i}$ are adjacent m-th roots of unity. The optimal conditioning occurs when all $\Delta_{i,i+1}$ satisfy floor$(m/(t-1))\leq\Delta_{i,i+1}\leq$ceil$(m/(t-1))$. The latter reflects an (almost) even distribution on the unit circle. Although the $\kappa_i$ are fixed, it is possible to redistribute the evaluations $\Phi_{i,1}=\omega^{\kappa_i}$ on the unit circle as follows. Randomly choose a magnifying factor $r\in\{1,\ldots,m-1\}$ with r and m relatively prime and replace $\omega$ by $\exp(2\pi Ir/m)$. This means replacing $\xi_i$ by $\omega^{r(m/p_i)}$. Then $\kappa_i$ becomes $$k_1^{(i)}\frac{rm}{p_1} + \ldots + k_d^{(i)}\frac{rm}{p_d},$$

$$i=1,\ldots,t$$

and $\Delta_{ij}$ is replaced by $(r|\kappa_i-\kappa_j|)\mod(\text{floor}(m/2))$. If $t\ll m$, then there exists $\Delta\in\mathbb{N}$, $\Delta>1$ such that for the new values, with high probability, $\Delta_{ij}\geq\Delta$ and $$\min_{1\leq i\leq t} \prod_{j\neq i} |\Phi_{i,1}-\Phi_{j,1}|^2 = \min_{1\leq i\leq t} \prod_{j\neq i} (2-2\cos(2\pi\Delta_{ij}/m))$$

is acceptable. We illustrate this with the following example. Take the univariate (d=1) sparse model specified by $m=p_1=401$, $t=4$, $k^{(1)}=397$, $k^{(2)}=398$, $k^{(3)}=399$, $k^{(4)}=400$. Then the eigenvalues are clustered as in FIG. 3 (r=1) and roughly $\text{cond}_\infty(V)=4.16\times10^6$. Now randomly choose $0<r<m$. Then the eigenvalues are relocated as in FIG. 4 (for r=229) and FIG. 5 (for r=347) with condition numbers respectively given by $\text{cond}_\infty(V)=5.87\times10^0$ and $\text{cond}_\infty(V)=1.90\times10^1$.

Figure 6:
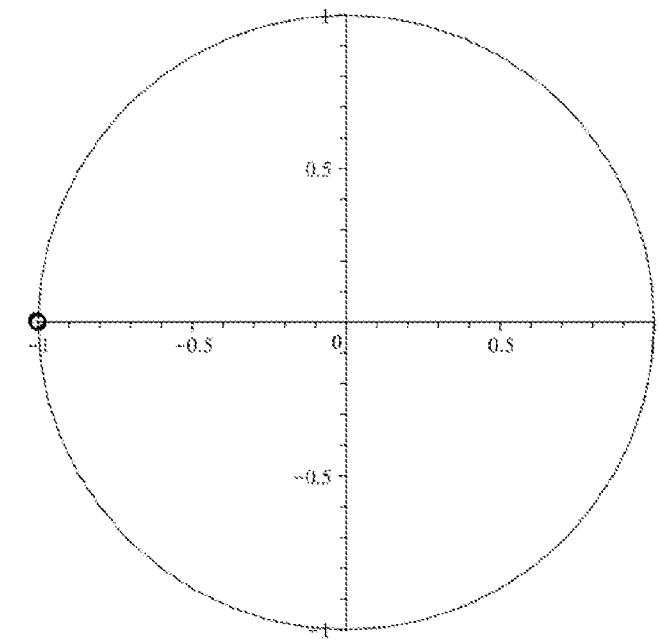
FIG. 6 shows a clustering of eigenvalues not on the unit-circle, as can occur in an example according to an embodiment of the present invention.
Figure 7:
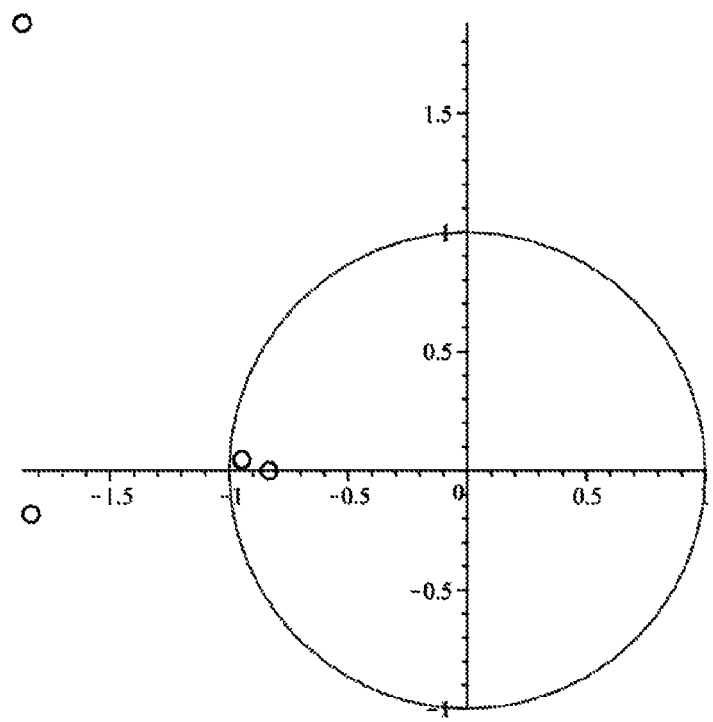
FIG. 7 shows a relocation of eigenvalues not on the unit-circle, as can be obtained in an example according to an embodiment of the present invention.

In the trigonometric example, using cosine elements $\phi_{k^{(i)}}$ with real $k^{(i)}$ (or for $\Re(k^{(i)})$) combined with a similar relocation of the sample points as above, we find that $$\|V^{-1}\|_\infty \leq \max_{1\leq j\leq t} \prod_{i=1, i\neq j}^{t} \frac{1+|\cos(2\pi k^{(i)}r/M)|}{|\cos(2\pi k^{(i)}r/M)-\cos(2\pi k^{(j)}r/M)|}$$

where $r\in\{1,\ldots,M-1\}$ and r and M are relatively prime (when choosing a rational value $r=p/q$ we check whether p and qM are relatively prime). Again, the bound on $\|V^{-1}\|_\infty$ is acceptable for real $k_i$ (or for $\Re(k^{(i)})$), with high probability, if by choosing the magnifying factor r, the angles $2\pi k^{(i)}r/M$ are suitably distributed. This is the case, for instance, when they are (almost) evenly distributed on the unit circle, meaning that the $\Phi_{i,1}=\cos(2\pi k^{(i)}r/M)$ are the Chebyshev nodes. Then $$\|V^{-1}\|_\infty \leq \frac{\sqrt[4]{27}\,|T_t(I)|}{2t}$$

where $T_t$ is the Chebyshev polynomial of the first kind of degree t. Another case is when the $\Phi_{i,1}$ are evenly distributed in the interval [−1,1]. Then the bound is only slightly worse. So for real frequencies $k^{(i)}$ (or for $\Re(k^{(i)})$), the above redistribution guarantees reasonable bounds on the condition number. The magnification of $2\pi k^{(i)}/M$ to $2\pi r k^{(i)}/M$ to improve the conditioning, can also be used when either M is very large, or when some frequencies $k^{(i)}$ are complex. We illustrate the latter with an example. Consider the univariate (d=1) sparse model specified by M=401, t=4, $k^{(i)}$=197−17.1, $k^{(2)}$=198, $k^{(3)}$=199−I0.57, $k^{(4)}$=200+I5.2. Then the eigenvalues are clustered as in FIG. 6 with $\text{cond}_\infty(V)=1.54\times 10^9$. With r=15 the condition number drops to $\text{cond}_\infty(V)=2.07\times 10^3$ and the eigenvalues are relocated as shown in FIG. 7.

We point out that when redistributing the sample points from $2\pi s/M$, s=0, . . . , 2t−1 to $2\pi sr/M$, s=0, . . . , 2t−1 for an r which is mutually prime with M and where $0\leq \Re(k^{(i)})<M/2$, then the cosine arguments $2\pi \Re(k^{(i)})r/M$ are bounded above by $r\pi$ instead of by $\pi$. Consequently, in the current example, the frequency $k^{(i)}$ is not uniquely determined anymore by the eigenvalue $\cos(2\pi k^{(i)}r/M)$. An example of how this problem can be overcome is indicated below.

The conditioning of the Vandermonde matrix can be further controlled by a divide-and-conquer technique described further below. This technique allows to limit the size of the Vandermonde matrices involved. In this way one also bounds the growth of the conditioning: a larger sparse fitting problem is divided into smaller subproblems of which the solutions can be reassembled into the solution of the larger problem.

In the following step, an example is provided of how the sparsity can be determined or tested, embodiments of the present invention not being limited thereto. When we are approximating f by a sparse model of the form in equation [1], then the value of t is determined by the accuracy required by the user, or the value of t is imposed. If we are reconstructing an exact sparse f, then the correct value of t may be revealed during the sampling process.

Indeed, interesting facts hold for the matrices A and B in the generalized eigenvalue problems shown in equations [3] and [5], and more generally for the matrices A and B in equation [2] that one obtains in a similar way from the use of general elements $\phi_{k^{(i)}}$. The t×t matrices A and B are regular and more can be said about the principal minors of A and B. From the Cauchy-Binet formula it is proved that all $\tau\times\tau$ principal minors ($\tau<t$) are algebraically nonzero expressions. By algebraically nonzero we mean that the minor is not an identically zero expression whatever $\Phi_{i,s}$. Only particular values for $\Phi_{i,s}$ can produce an occasional zero for the determinant. Moreover, for any size $\tau>t$ the determinants of A and B are identically zero. For $\tau=t$ the determinants of A and B are guaranteed to be nonzero if the $\Phi_{i,1}\neq 0$ and $\Phi_{i,1}\neq\Phi_{j,1}$ for distinct i and j.

These statements allow to reveal, with high probability, the cardinality t of the support, concurrently with the sampling. By building principal minors of increasing size, the value of t is obtained as the numerical rank of either A or B. The latter is computed using the singular value decomposition which is a well-conditioned problem for which very stable algorithms exist.

In the following step, it is illustrated how, in one example, the support can be uniquely extracted, embodiments of the present invention not limited thereto. In the class of problems we are dealing with, the generalized eigenvalues $\lambda_1, \ldots, \lambda_t$ may typically be related one-to-one to the elements $\phi_{k^{(i)}}$ that make up the sparse representation given in equation [1]. For instance, in the multinomial example $$\lambda_i = \omega^{m(k_1^{(i)}/p_1+\ldots+k_d^{(i)}/p_d)}$$

for smartly chosen $\omega$. A reverse application of the Chinese remainder theorem then reveals the multi-indices $k^{(i)}=(k_1^{(i)}, \ldots, k_d^{(i)})$ and hence the elements $$x_1^{k_1^{(i)}} \ldots x_d^{k_d^{(i)}},$$
$$i = 1, \ldots, t$$

in equation [1]. In the trigonometric example, with s=1 in equation [5], $\lambda_i=\cos(k^{(i)}\omega)$ for $\omega=2\pi/M$. The value $k^{(i)}$ is easily obtained from $\lambda_i$ if $0\leq \Re k^{(i)})<M/2$, because then $0\leq \Re(k^{(i)})\omega=\Re(k^{(i)})2\pi/M<\pi$. The latter condition is not satisfied if, in the sampling process, a magnifying factor r is used. Then $0\leq \Re k^{(i)})\omega=\Re(k^{(i)})2r\pi/M<r\pi$ with $1\leq r<M$ and gcd (r, M)=1.

For the sake of generality, we consider the problem when $\lambda_i=\exp(Ik^{(i)}\omega)$. When $1\leq r<M$, the set of frequencies corresponding to this eigenvalue consists of $K_i=\{k^{(i)}+lM/r:l\in \mathbb{Z}\}\cap ]-r\pi,r\pi[$, $\#K_i=r$.

Now comes the task of identifying the correct $k^{(i)}\in K_i$. This is easy, at the expense of an additional t samples $f_{s,\rho}$ at the points $$\xi^{(s,\rho)} = \frac{2\pi(sr+\rho)}{M},$$
$$s = j, \ldots, j+t-1$$

with $0<|\rho|<M$, gcd ($\rho$, M)=1, gcd ($\rho$, r)=1 and $j\in\{0, \ldots, t\}$ (when choosing a rational value $\rho=\mu/\nu$ we check whether $\mu$ and $\nu M$ are relatively prime, and the same for $\mu$ and $\nu r$; this extends in the same way to $\rho$ and r both rational). We proceed as follows.

With the eigenvalues $\Phi_{i,1}=\exp(Ik^{(i)}2r\pi/M)$ we compose the t×t matrix V where V is the Vandermonde matrix with nodes $\Phi_{i,1}$. Note that the eigenvalues $\Phi_{i,1}$ come in a certain order, which need not respect the assumed order $0\leq|\Re(k^{(1)})|<\ldots<|\Re(k^{(t)})|$ because the $k^{(i)}$ are still unknown. But we can already compute the coefficients $\alpha_1, \ldots, \alpha_t$, e.g. from $$V\begin{pmatrix}\alpha_1\\ \vdots \\ \alpha_t\end{pmatrix}=\begin{pmatrix}f_0\\ \vdots \\ f_{t-1}\end{pmatrix}. \quad [7]$$

So we associate an eigenvalue $\Phi_{i,1}$ with the coefficient $\alpha_i$ in the sparse model of equation [1]. Now the newly collected samples at $\xi^{(s,\rho)}$ can be interpreted as $\Sigma_{i=1}^{t}\alpha_i\exp(Ik^{(i)}2\pi(sr+\rho)/M)=\Sigma_{i=1}^{t}(\alpha_i\exp(Ik^{(i)}2\pi\rho/M))$
$\exp(Ik^{(i)}2\pi sr/M), s=0, \ldots, t-1$.

This gives the linear system of equations $$V\begin{pmatrix}\alpha_1\exp(Ik^{(1)}2\pi\rho/M)\\ \vdots \\ \alpha_t\exp(Ik^{(t)}2\pi\rho/M)\end{pmatrix}=\begin{pmatrix}f_{0,\rho}\\ \vdots \\ f_{t-1,\rho}\end{pmatrix}.$$

This linear system has the same coefficient matrix as in equation [7]. After computing the new unknowns $\alpha_i \exp(Ik^{(i)} 2\pi\rho/M)$ for $i=1, \ldots, t$, we can divide these unknowns by the $\alpha_i$ computed above. So to each $i=1, \ldots, t$ are tied two sets of candidate frequencies, namely on the one hand $K_i$ and on the other hand $$K_{i,\rho} = \{k^{(i)} + lM/\rho : l \in \mathbb{Z}\} \cap ]-\rho\pi, \rho\pi[, \#K_{i,\rho} = \rho.$$

We know they are tied together because they both go with the same coefficient $\alpha_i$ from equation [1]. Because of the relationship between r, ρ and M, we have for each $i=1, \ldots, t$ that $K_i \cap K_{i,\rho}$ is a singleton, hence $$K_i \cap K_{i,\rho} = \{k^{(i)}\}, \quad i=1, \ldots, t.$$

If desired, the $k^{(i)}$ can be renumbered to satisfy $0 \leq |\Re(k^{(1)})| < \ldots < |\Re(k^{(t)})|$.

Note that the number of required additional samples is dictated by the nature of the element $\phi_k$. For $\phi_k = \exp(Ikx)$, an additional t samples suffice. For $\phi_k = \cos(kx)$ we need 2t additional samples at $\xi^{(s,+\rho)}$ and $\xi^{(s,-\rho)}$ to be combined into $(f_{s,+\rho} + f_{s,-\rho})/2$, $s=j, \ldots, j+t-1$ with $j \in \{0, \ldots, t\}$. And remember that with r=1 or for non-periodic $\phi_k$ no additional samples are required.

By way of example, in the following step, an illustration of how the reconstruction can be performed is described below, embodiments of the present invention not being limited thereto.

Despite having 2t samples at our disposition, there is no need to compute the coefficients $\alpha_i$, $i=1, \ldots, t$ in equation [1] from a (2t)×t least squares problem. As indicated above, a t×t interpolation problem is sufficient. An additional t interpolation conditions are linearly dependent and come for free because of the fact that the support parameters $k^{(1)}, \ldots, k^{(t)}$ are fixed by the generalized eigenvalue problem. If $\Phi_{i,s}$ still denotes the element $\phi_{k^{(i)}}$ evaluated at the (s+1)-th smart sample point, where the values for $k^{(i)}$ are obtained in the previous step, then the $\alpha_i$ are obtained from $$\begin{pmatrix} \Phi_{1,j} & \cdots & \Phi_{t,j} \\ \vdots & & \vdots \\ \Phi_{1,j+t-1} & \cdots & \Phi_{t,j+t-1} \end{pmatrix} \begin{pmatrix} \alpha_1 \\ \vdots \\ \alpha_t \end{pmatrix} = \begin{pmatrix} f_j \\ \vdots \\ f_{j+t-1} \end{pmatrix},$$

$$j \in \{0, \ldots, t\}.$$

In the following example, it is illustrated how one copes with complexity, embodiments of the present invention not being limited thereto. The sampling involves O(t) measurements and the sparsity test, generalized eigenvalue problem and final interpolation problem require altogether $O(t^3)$ operations using standard off-the-shelf implementations. In the numerical linear algebra algorithms, the structure and symmetry of the matrices A, B and W can further be exploited to bring the complexity down to $O(t^2)$. This is in sharp contrast to the technique of compressed sensing where f is approximated by an optimal (in the $l_1$ norm sense) linear combination of t elements selected out of a large signal dictionary. The number of measurements required by compressed sensing does not only depend on the sparsity t but also on the dictionary size. Moreover, its algorithmic complexity depends on the sparsity t, the dictionary size and the Nyquist rate M.

By way of illustration, an alternative to bring the complexity further down, referred to as a divide-and-conquer technique, is described below, embodiments of the present invention not being limited thereby.

While our smart choice for the sample points controls and slows down the growth of the condition number of the Vandermonde matrices V, it may still be insufficient to keep the conditioning within the desired bounds. If this occurs, the following technique, used to solve a system of linear congruences, can be applied. It is based on the connection between periodicity and modular or clock arithmetic.

Assume that, while building the principal minors of the matrices A or B in order to obtain t, we note that t is growing to such extent that V becomes ill-conditioned. Or assume that one is interested a priori in a sparse model with a rather large t, for instance because the $k^{(i)}$ are not really few but rather are spread out quite a lot. Then it may be useful to divide t into a sum $t = t_1 + \ldots + t_n$, $t_i \neq 0$, $i=1, \ldots, n$. We describe how this splitting of equation [1] into $$\Sigma_{k^{(i)} \in I_j} \alpha_i \phi_{k^{(i)}}, \quad \#I_j = t_j, \quad U_{j=1}^n I_j = \{k^{(1)}, \ldots, k^{(t)}\} \quad [8]$$

can be carried out. Again the properties of the elements $\phi_{k^{(i)}}$ in combination with the sample points play a role. As an example we treat the case $\phi_{k^{(i)}}(x) = \exp(I2\pi k^{(i)} x)$ with $k^{(i)}$ integer, which is at the basis of the trigonometric family of functions and the polynomials. The latter is not a restriction since essentially each $k^{(i)}$ in our discussion is a floating-point number, hence rational, and then the sparse modelling problem can be reformulated such that $k^{(i)}$ is integer. With $0 \leq k^{(1)} < \ldots < k^{(t)} < M/2$ and $0 \leq h \leq M-1$ fixed, we define $$g_h(y) = f(h/M + y).$$

The evaluations $$g_h(y_\ell) = \sum_{i=1}^t \alpha_i \exp\left(I 2\pi k^{(i)} \left(\frac{h}{M} + \frac{\ell}{n}\right)\right),$$

$$y_\ell = \ell/n,$$

$$\ell = 0, \ldots, n-1$$

can be reassembled as $$g_h(y_l) = \Sigma_{i=1}^t \alpha_i \exp(I2\pi k^{(i)} h/M) \omega^{lk^{(i)}}, \quad \omega = \exp(I2\pi/n).$$

For the $\phi_{k^{(i)}}$ in use and the sample points $y_l$ we have the useful property for $1 \leq l \leq n-1$ that $$1 + \omega^l + \ldots + \omega^{(n-1)l} = 0$$

because $\omega^n = 1$. In addition, for l=0 it holds that $$1 + \omega^l + \ldots + \omega^{(n-1)l} = n.$$

Therefore $$\sum_{\ell=0}^{n-1} \omega^{-\ell j} g_h(y_\ell) = \sum_{k_i \in I_j} \alpha_i \exp\left(\frac{I2\pi k^{(i)} h}{M}\right),$$

$$I_j = \{k^{(i)} \equiv j \bmod n\},$$

$$j = 1, \ldots, n.$$

In this way, the n evaluations $g_h(y_0), \ldots, g_h(y_{n-1})$ for a fixed h are equivalent to one evaluation of the n separate partial sums of f given in equation [8]. This step can be repeated for different values of h to provide the required number of samples. A simple test reveals whether a set $I_j$ has remained empty during the procedure: then the zero value for the partial sum over $I_j$ must persist throughout different values for h. Should the cardinalities $t_j$, j=1, ..., n still be too large, the division step can be repeated with a larger n.

By way of illustration, embodiments of the present invention not being limited thereto, a number of applications is further discussed below. Sparse techniques generate compact models, while sparse sampling tackles the data deluge. The new technique realizes all this with very low computational complexity. Hence the number of applications is plentiful. Sparse representations are most popular in:

- biomedical signal processing (bio-electrical signals, MRI, tomography, shape representation and recognition, medical scanners, BCI, ... ),
- signal processing (speech signals, audio and video signals, filtering, compression, digital cameras, holography, hyperspectral imaging, ... ),
- civil engineering (pressure waves, power systems, sonar, electrical and electronic engineering, ... ),
- telecommunication/telemonitoring (wireless transmission, sensor networks, ambient living, wideband, multiband, analog-to-information conversion, ... ),
- high-resolution imaging (high-frequency radar, telescopes, geophysical data, surface characterization, unmanned surveillance, ... ),
- physics and chemistry (constant coefficient differential equations, autoregressive methods, econophysics, time series, ... ).

Methods according to embodiments of the present invention could for example be implemented for all these applications. By way of illustration, examples for the first three application domains are shown below. Each of these worked out examples have connections with the other application domains mentioned above and hence are very representative.

Turning now first to the example of biomedical signals. The acquisition and processing of bioelectrical signals that appear in the human body is a common theme in clinical studies for evaluating the health status of a patient. The electrical activity of cells and tissue can be recorded from different organs. Examples of bioelectrical recordings are the electrocardiogram (ECG), the electroencephalogram (EEG), the electrolaryngram (ELG), the electromyogram (EMG) and the electro-oculogram (EOG), which measure respectively the electrical activity in the heart, brain, larynx, muscles and eyes. The current medical monitoring devices become smaller and wireless and hence demand ever more sophisticated techniques to acquire and process data. The new sampling and approximation technique can be used to reduce the amount of data samples to be stored or transmitted. Using trigonometric or dedicated functions for the functions $\phi_{k^{(i)}}$ in a method according to embodiments of the present invention, the biomedical signals can be reconstructed from far less measurements than usual.

Figure 8:
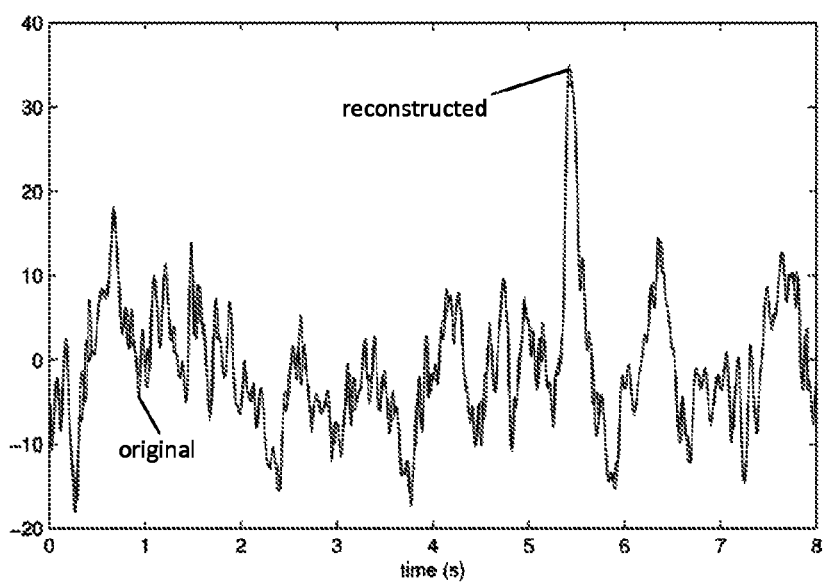
FIG. 8 shows an EEG signal and a corresponding reconstructed signal, as can be obtained in an embodiment according to the present invention.
Figure 9:
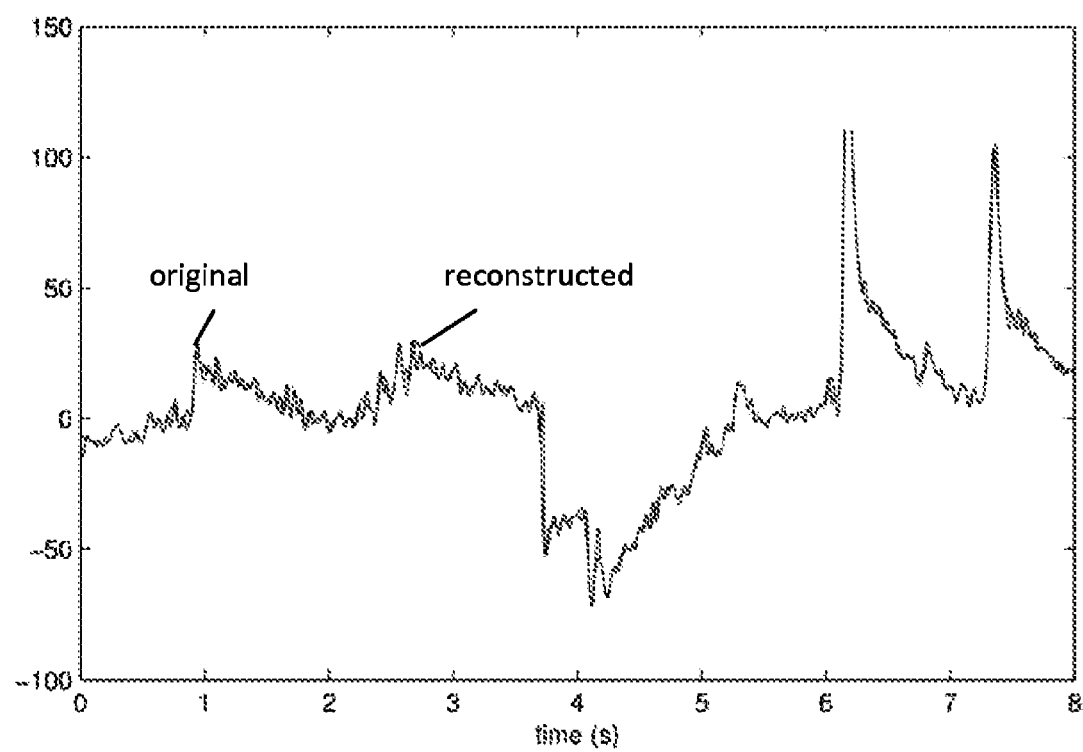
FIG. 9 shows an EOG signal and a corresponding reconstructed signal, as can be obtained in an embodiment according to the present invention.

As is common practice in signal processing, the bioelectrical signal is partitioned in smaller windows. We approximate the signal in each window by an expression of the form of equation [1] with an a priori fixed t which is constant over the considered window. The samples are collected at a fraction 1/r of the Nyquist rate M (in Hertz), hence achieving a compression rate of (100/r) %. The reconstruction follows at least some of the features described herein. Here t typically is fixed a priori and is sufficiently small. Each 2t samples cover a window of length 2tr/M (in seconds) and the information in the underlying signal is represented as $$f(x) = \sum_{i=1}^{t} \alpha_i \phi_{k^{(i)}}(x), \phi_{k^{(i)}}(x) = \cos(k^{(i)}x),$$

with $k^{(i)}$, i=1, ..., t and $\alpha_i$, i=1, ..., t as described above. Alternatively, a phase shift can be included. We show the representation of both an EEG and an EOG signal in FIG. 8 (M=250, r=9, t=6) and FIG. 9 (M=250, r=11, t=3) respectively. The data are taken from the site www.cs.colostate.edu/eeg/eegSoftware.html#keirndata.

We note that both signals were filtered using a bandpass filter of 1-20 Hz before applying the new technique, but this step can be omitted. Typically, a similar result can be achieved for an unfiltered EEG or EOG signal from about 10% of the original data sampled at 250 Hz.

Likewise, (biomedical) scanners can be made faster because the amount of data that needs to be collected to reconstruct an image can be hugely reduced. Considering the fact that the image is almost certainly compressible—when combined with an appropriate transform—one can immediately reduce the number of measurements. And the fact that the measurements are not collected in a random way, guarantees that the reconstruction is entirely predictable. Also the image reconstruction time is very reasonable because of the low complexity of the new technique.

In a second particular example, the application of audio signal processing is discussed. To restore a signal from samples, the classical theory says that one needs to have sampled at the Nyquist rate, which is (at least) twice the bandwidth or maximum component frequency of the signal. On the other hand, when represented in terms of appropriate elements $\phi_k$, such as trigonometric functions with non-integer frequencies or wavelets, most signals have relatively few nonzero coefficients and hence are compressible. Besides offering a compact representation, our technique also has an impact on the acquisition. Our minimal number of required samples 2t is directly proportional to the number of terms t in the sparse model for the information carried by the signal. To reconstruct the signal from only a fraction of the number of samples required traditionally, embodiments according to the present invention are used. We illustrate the procedure on a simple audiofile taken from sunbeam.ece.wisc.edu/csaudio/ and we compare the results with the ones obtained using compressed sensing.

Figure 10:
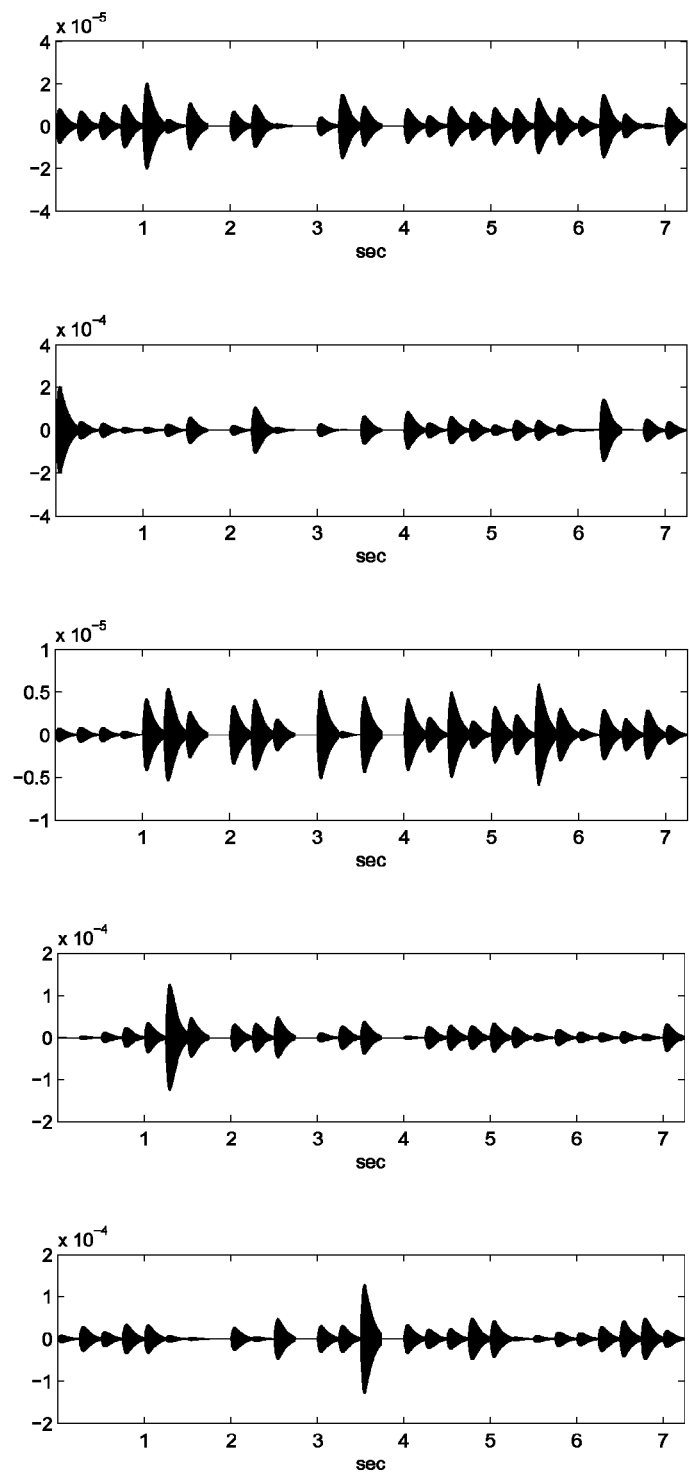
FIG. 10 shows the error curves for compressed sensing reconstruction of an audio signal (with 1229 random samples), as known from prior art.

A song containing 29 notes, each lasting 0.25 seconds and each decaying according to the same model (only the real frequency k differs), namely $$(1+\exp(-15/4)-\exp(-15x))\exp(-15x)\sin(2\pi kx), \quad [9]$$

is sampled industrially at M=44100 Hz, meaning that x in the equation above takes the values x=j/44100 for j=1, ..., 11025. The result is a data vector of 319725 entries for the song or 11025 samples per note. The 100 valid frequencies k in $\sin(2\pi kx)$, which form a pianobasis, vary between 16.35 and 4978.03. The melody can be seen as a linear combination of t=29 vectors, each containing only one note, meaning one instance of equation [9] for some valid frequency k, during one particular quarter of a second with the 28 other quarter seconds blank. When undersampling the song randomly at about 42 samples per note (1229 samples in total), a reconstruction following the compressed sensing principle reveals a combination of pianobasis frequencies that approximates the song quite well. Because of the randomness in the sampling, the reconstructed signal may vary. To illustrate the probabilistic aspect, we plot the resulting error curves for the reconstructed signal compared to the original song, obtained in 5 different runs. The 5 error curves for a compressed sensing reconstruction of the audio signal (1229 random samples) in FIG. 10 confirm that the reconstruction is almost perfect: errors are of the magnitude of $10^{-4}$ to $10^{-5}$ on average.

Figure 11:
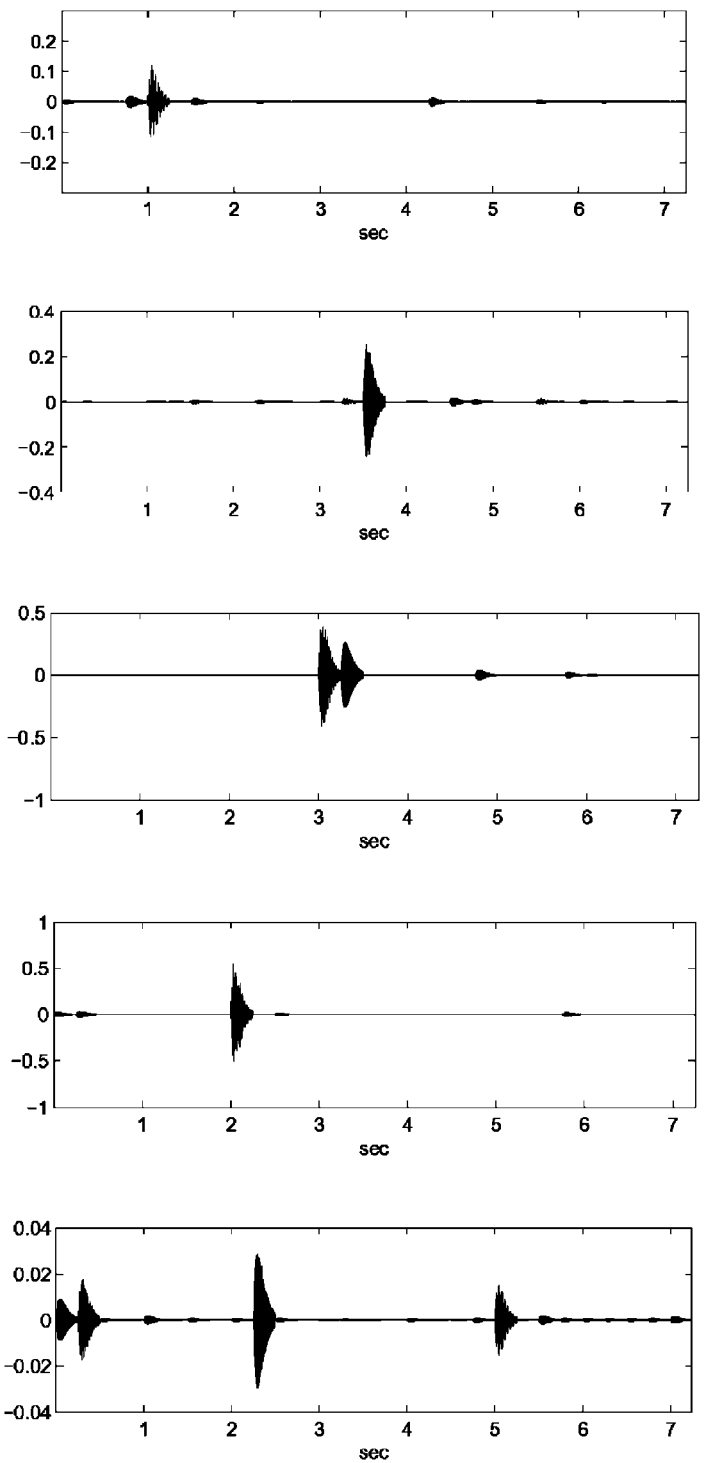
FIG. 11 shows the error curves for compressed sensing reconstruction of an audio signal (with 456 random samples), as known from prior art.

When repeating the experiment with only about 16 random samples per note (456 samples in total), the reconstruction using the compressed sensing technique fails, as can be seen in FIG. 11, containing the 5 error curves for a compressed sensing reconstruction of the audio signal (456 random samples).

When using the new technique, replacing the expression sin(2πkx) by $$\frac{\exp(I2\pi kx) - \exp(-I2\pi kx)}{2},$$

hence doubling the number of terms to t=58, all frequencies can be retrieved exactly and the error curve is of the order of machine precision. But what is most remarkable is that per note only 6 samples are necessary, resulting in a total of only 174 samples for a perfect reconstruction! The sampling is an application of techniques as described above. Because of the large value for M, namely M=44100, the usual distance between consecutive sample points $\xi^{(s)}$=s/M and $\xi^{(s+1)=(s+1)}$/M is very small and may lead to ill-conditioning. Even for the identification of only one note from a 2×2 generalized eigenvalue problem, the condition number of the underlying Vandermonde matrix is reduced by a factor 10 if the samples are redistributed according to $\xi^{(s)}$=rs/M and $\xi^{(s+1)=(s+1)}$/M with the magnifying factor r satisfying gcd(r, M)=1. As explained, in that case, for a unique retrieval of the frequencies $k_i$, the uniform sampling needs to be performed twice, once to collect 2t samples with magnifying factor r, and once to collect an additional t samples with identification shift ρ, satisfying gcd(ρ, M)=1, gcd(r,ρ)=1. So, putting it all together, we have that per note t=2, that hence 2t=4 samples per quarter second are required, and that an additional t=2 samples are used for the unique identification of the frequency. So we need 6 samples per note. For the audio signal in question we took r=3659 and ρ=11.

Let us add a note on the side. The recognition that the amount of information in many interesting signals is much smaller than the amount of raw data produced by conventional sensors, should lead to the development of a sparse sensor. Rather than first acquiring a massive amount of data and then using algorithms to compress it, the sparse acquisition and compact representation can now be combined. Possible applications include, besides audio signals, also imaging, digital cameras, tomography, analog-to-information conversion, etc.

In a third example, detection of a transient is discussed. A transient is used to refer to any signal or wave that is short lived. Transient detection has applications in power line analysis, speech and image processing, turbulent flow applications, to name just a few. For instance, in a power system signal, which is highly complicated nowadays because of the constantly changing loads and the dynamic nature, transients can be caused by many things, such as lightnings, equipment faults, switching operations and so on. Transients are then observed as short lived high-frequency oscillations superimposed on the voltages or currents of fundamental frequency, being 50/60 Hz, as well as exponential components. A signal model incorporating these discontinuities can be given by $$f(x) = \sum_{i=1}^{t} \alpha_i e^{-\beta_i(x-a_i)} \cos(2\pi \gamma_i x + \delta_i) 1_{[a_i, z_i[},$$

where $\alpha_i$ is the amplitude, $\gamma_i$ is the frequency (an integer multiple of the fundamental frequency), $\delta_i$ is the phase angle, $\beta_i$ is the damping factor and $a_i$ and $z_i$ are the starting and ending times of the component. When expressing $\alpha_i e^{-\beta_i(x-a_i)} \cos(2\pi\gamma_i x + \delta_i)$ as $$\frac{\alpha_i e^{I\delta_i}}{2} e^{-\beta_i(x-a_i) + 2\pi I \gamma_i x} + \frac{\alpha_i e^{I\delta_i}}{2} e^{-\beta_i(x-a_i) - 2\pi I \gamma_i x},$$

the technique as illustrated in embodiments above can be applied. We point out that this rewrite implies that the model now contains 2t terms instead of t. Hence in the sequel we refer to the number of terms in the model by 2t. It is known that it is difficult to take the discontinuities from $1_{[a_i, z_i[}$ into account, meaning the damped signals to start at different instants. Using our sparsity test described above, the method can detect at each instant how many (and afterwards which) components are present in the signal. We model the synthetic signal for which $[a_1, z_1[=[0, 0.0308[, [a_2, z_2[=[0.0308, 0.0625[, [a_3, z_3[=[0.0625, 0.1058[,$ or expressed in multiples of the applied sampling rate M=1200, $[a_1, z_1[=[0/M, 37/M[, [a_2, z_2[=[37/M, 75/M[, [a_3, z_3[=[75/M, 127/M[.$ This implies that at every moment only one term is present in the signal, but the characteristics of that term may change. So the actual 2t equals 2. We have furthermore the parameter values in the table,

| i | $\alpha_i$ | $\beta_i$ | $\gamma_i$ | $\delta_i$ |
|---|---|---|---|---|
| 1 | 1.000 | 0 | 60 | $-\pi/2$ |
| 2 | 1.000 | 0 | 60 | $-\pi/2$ |
| 3 | 1.000 | 0 | 60 | $3\pi/4$ |

Figure 12:
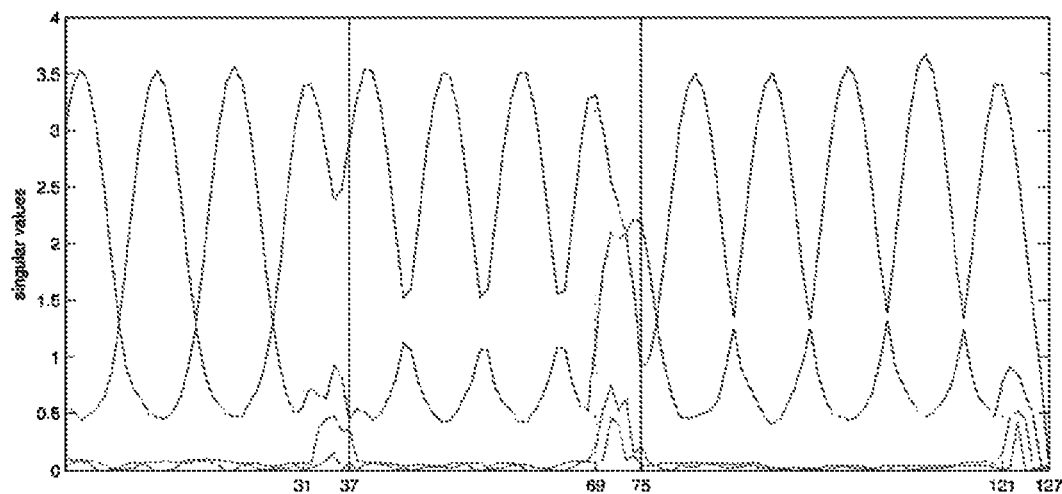
FIG. 12 shows a result of the transient detection using a method according to an embodiment of the present invention.

In FIG. 12 (with M=1200, r=1 and 2t=2), we show merely the result of the discontinuity detection (the actual values of the parameters $\alpha_i$, $\beta_i$, $\gamma_i$, $\delta_i$ can of course be determined simultaneously). When 2t=2, then our test reveals that the singular value decomposition shown in FIG. 12 of the slightly larger 2 (t+1)×2 (t+1) matrix $H_4^{(1)}$ (or $H_4^{(0)}$) delivers two clearly nonzero and two numerically zero singular values. This pattern is disrupted every time a sample sneaks into the matrices that does not belong to the signal that is being monitored, in other words at x=37/M, 75/M, 127/M. Because the matrices contain the samples $f_r, \ldots, f_{r+6}$ the disruption is visible from x=31/M, 69/M, 121/M on. The disruption disappears as soon as the samples are all in line again with the same 2t underlying components.

We did not make use of a magnifying factor r here. Too sparse sampling may even overlook the transient. The advantage of our technique is that it reveals the structure in the signal, a structure that classical methods have difficulties with. In addition, we mention that uniformly distributed noise in [−0.05,0.05] was added to the samples of the synthetic signal.

By way of illustration, a comparison with known techniques is given below, indicating features and advantages of embodiments of the present invention. The classic way to decompose a signal in terms of complex exponential components exp (Ikx) is to compute its Fourier transform. For the discrete Fourier transform of a signal f containing frequencies k that satisfy 0≤|ℜ (k)|<M/2, the signal is sampled at $\xi^{(s)}$=2πs/M, s=0, . . . , M−1 to avoid aliasing of the frequencies, that is, various frequencies adopting the value of one particular frequency, usually the smallest positive frequency of all the aliased ones. Besides the aliasing problem, there is also the problem of leakage because of the discrete values for k in the components exp (Ikx): spikes in the power spectrum that cannot be caught exactly, leak out into nearby parts of the spectrum. The latter problem can be avoided by allowing a continuum of frequencies as in de Prony's method. De Prony developed a method to extract valuable information from a uniformly sampled signal and build a model using sums of exponentials with unknown exponents. In our notation, de Prony's result is the following. Let $$f(x)=\sum_{i=1}^{t}\alpha_i\exp(Ik^{(i)}x), 0\leq |\Re(k^{(i)})|<M/2.$$

For $\omega=2\pi/M$ and $f_s=\exp(Is\omega)$, $s=0, \ldots, 2t-1$ with (in general) $2t-1<M$, the frequencies $k^{(i)}$ and the amplitudes $\alpha_i$ can be determined. But the conditioning of the problem strongly depends on the distribution of the frequencies of the signal (see the FIG. 3-5). In de Prony's method, as it is known up to now, there is no remedy for this possible ill-conditioning. As described above, the choice is offered of using a magnifying factor r to control the conditioning. As a consequence $r(2t-1)<M$ is not satisfied in general anymore. The problem that arises because of this, is that the frequencies corresponding to the eigenvalues $\lambda_i$, $i=1, \ldots, t$ are not uniquely defined anymore: their real part is bounded in absolute value by $r\pi$ instead of by $\pi$. A solution for the latter is also described above. To summarize:

- With the Fourier transform, one samples the signal in the time domain at the Nyquist rate and computes a representation in a discretized frequency domain. Because of the discrete frequencies the representation may not be sparse while the signal is.
- Using de Prony's method, the Nyquist rate still dictates the sampling interval, but fewer samples are required. The allowed continuity of the frequency domain avoids the leakage problem and leads to truly sparse models. But de Prony's method is often ill-conditioned and then useless.
- Embodiments of the present invention offer a technique using samples spaced at a (proper) multiple of the Nyquist rate, and valid for a discrete as well as a continuous frequency range.

This is now illustrated with two synthetic signals, an undamped sinusoid and a damped complex exponential. Both signals are first considered noise-free and then with added Gaussian noise for different signal-to-noise ratios.

Figure 13A:
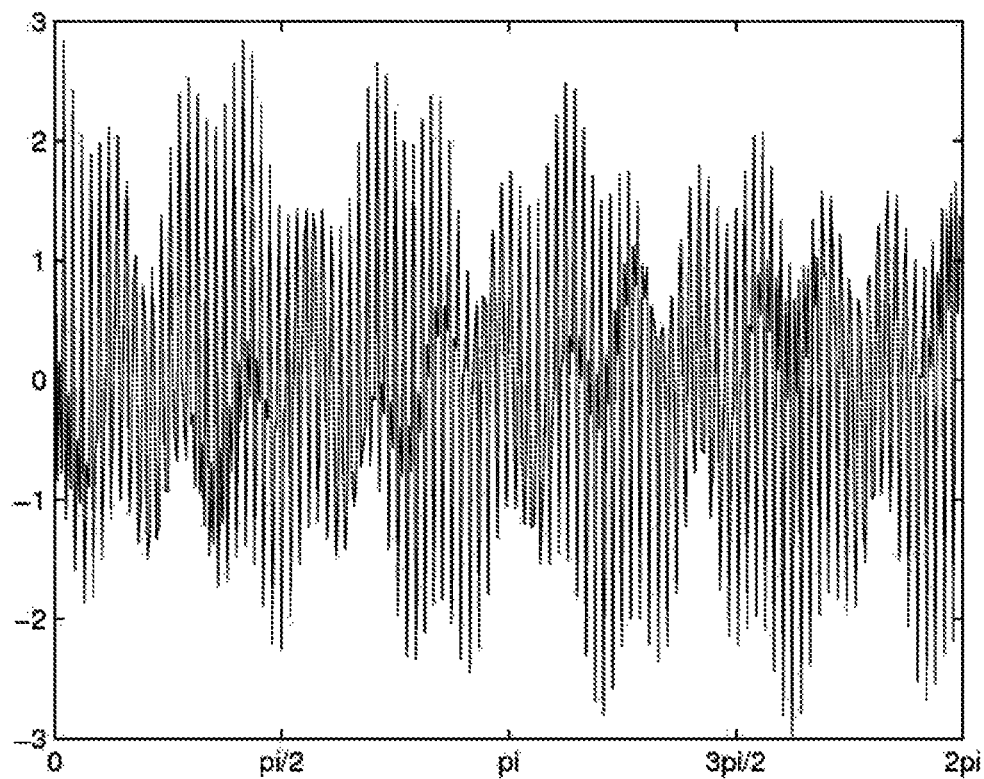
FIG. 13a to FIG. 14d illustrate two examples of comparisons between known reconstruction techniques and a data reconstruction technique according to an embodiment of the present invention.
Figure 13B:
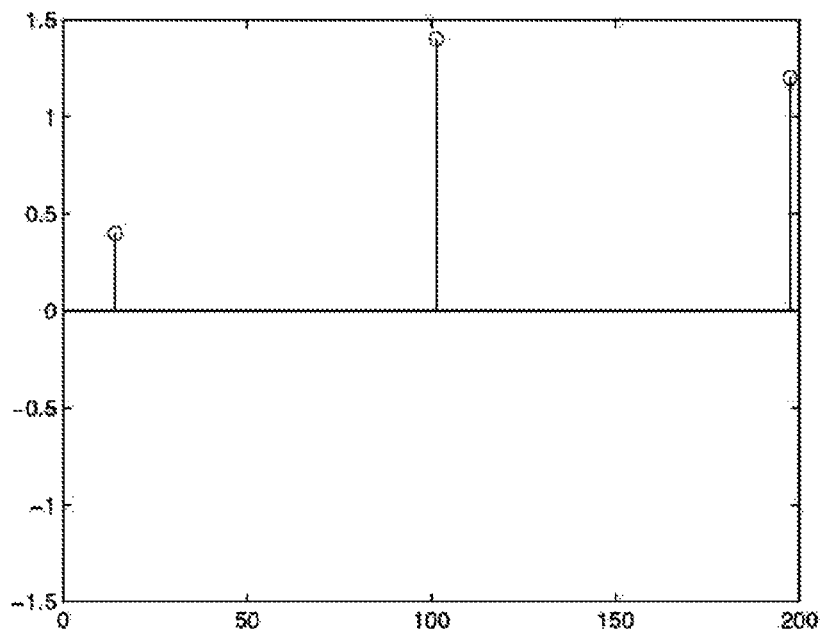
Figure 13C:
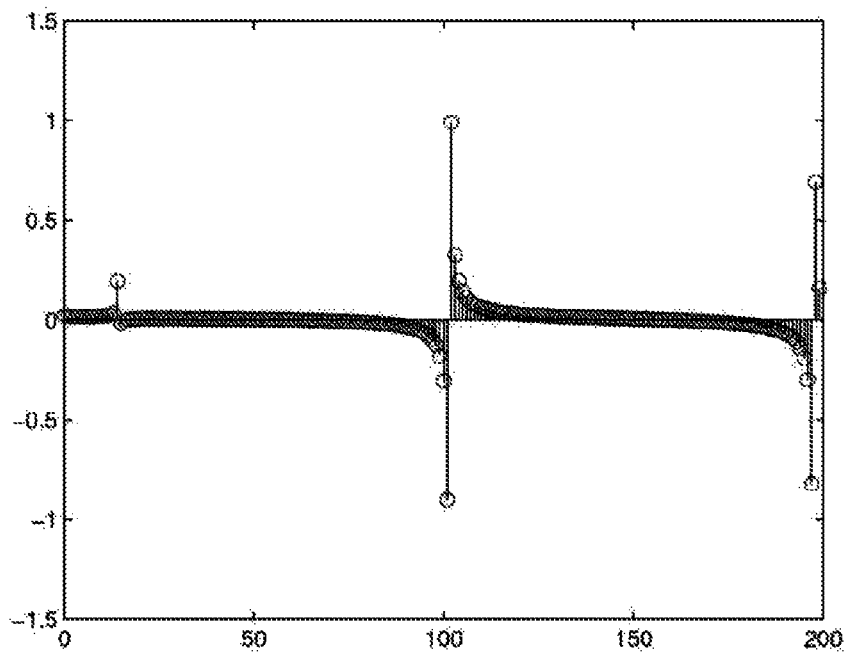
Figure 13D:
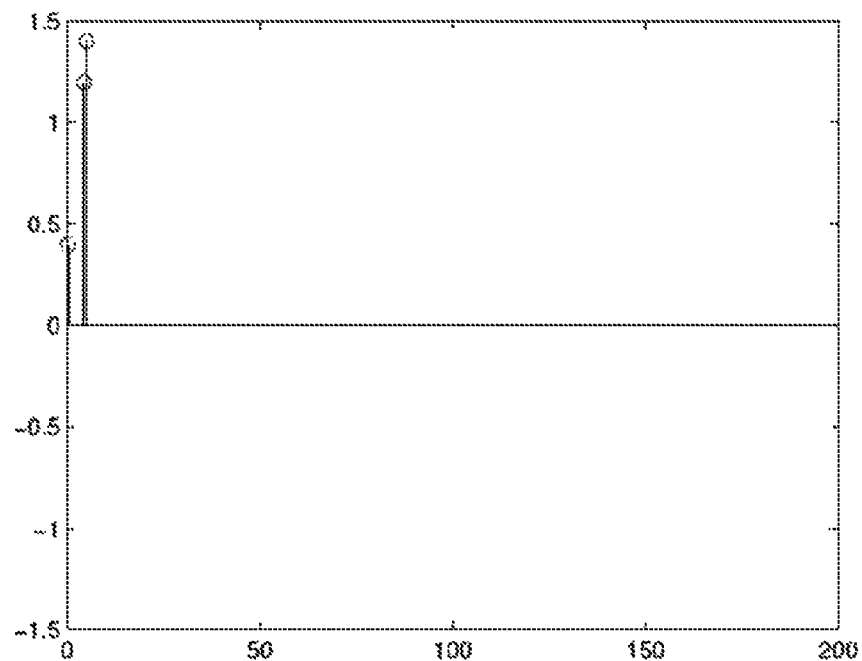
Figure 13E:
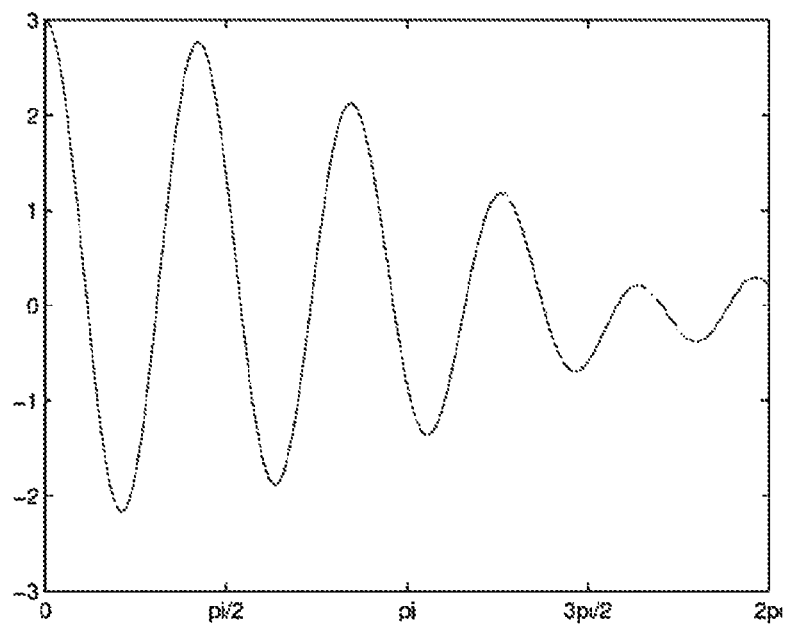

Of the undamped signal (FIG. 13*a*)

$$f(x)=1.2\cos(197.5x)+0.4\cos(10\sqrt{2}x)+1.4\cos(101.5x), 0\leq x\leq 2\pi$$

with Nyquist rate M=400 and t=3, we depict three different frequency spectra. The spectrum shown in FIG. 13*b* is the true signal spectrum. The spectrum shown in FIG. 13*c* suffers from the typical leakage, and the spectrum shown in FIG. 13*d* is obtained using de Prony's method on data undersampled at an r-fold of the Nyquist rate (r=29). FIG. 13*e* shows the signal obtained from de Prony's reconstruction based on the undersampled input. Using the approach according to an embodiment of the present invention on the same undersampled data, we are able to deliver the original spectrum shown in the top right image, at the price of sampling additionally at the 6 points $(sr\pm\rho)\omega$, r=29, $\rho=1$, s=i, ..., i+2 with i either 0, 1, 2 or 3!

When adding Gaussian noise to the undamped synthetic signal, the amplitudes and frequencies can still be retrieved accurately from the similarly (r=29) undersampled data. We find values $$err(\alpha) = \frac{\|\alpha - \tilde{\alpha}\|_2}{\|\alpha\|_2},$$

$$err(k) = \frac{\|k - \tilde{k}\|_2}{\|k\|_2}$$

as in the table,

| SNR | err($\alpha$) | err(k) |
|---|---|---|
| 0.020 (34 dB) | 0.036 | 0.0277 |
| 0.010 (40 dB) | 0.018 | 0.0146 |
| 0.001 (60 dB) | 0.002 | 0.0015 | where $\alpha$ and k denote the true amplitude and frequency vectors, and $\tilde{\alpha}$ and $\tilde{k}$ denote the computed amplitude and frequency vectors of the noisy signal. The error vector norms are averaged over 1000 different random runs.

Figure 14A:
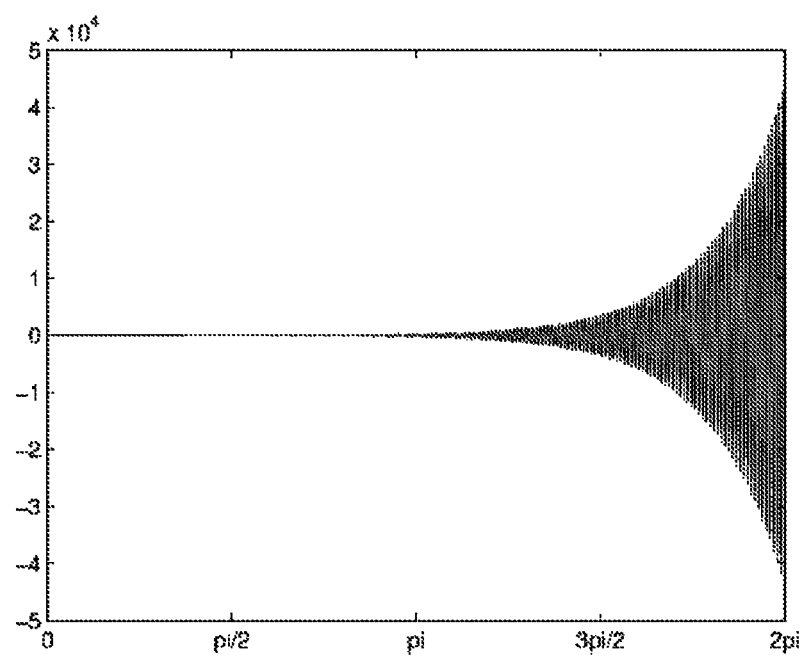
Figure 14B:
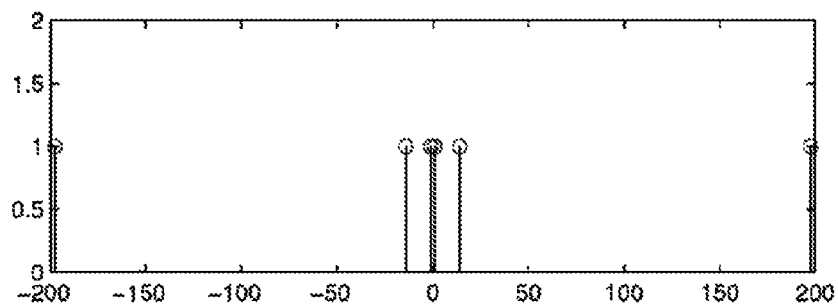
Figure 14B:
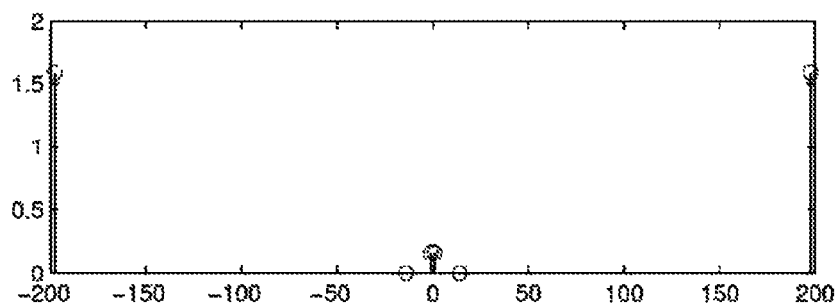
Figure 14C:
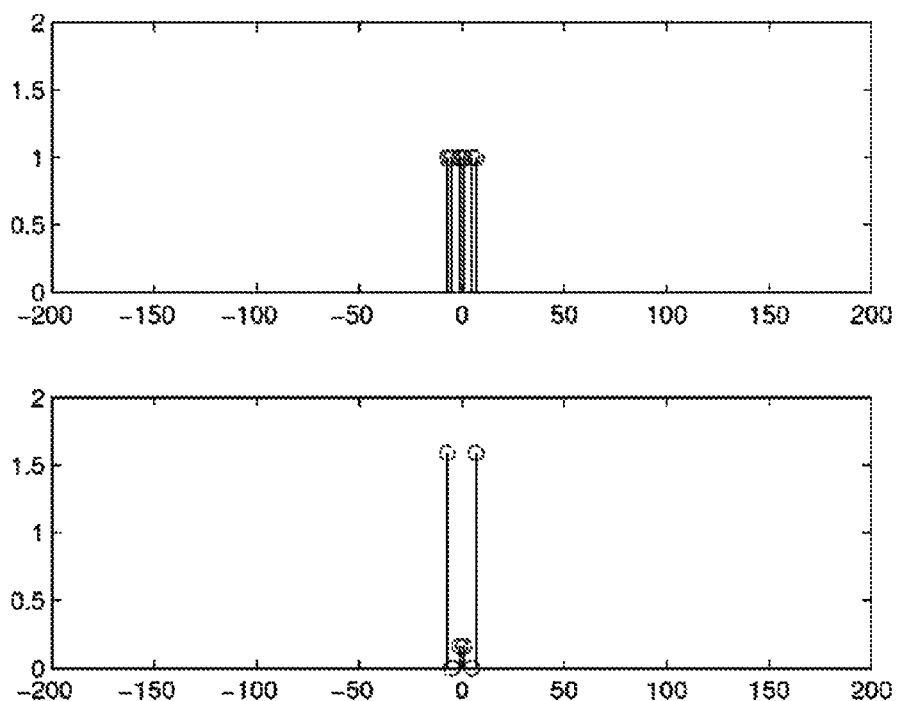
Figure 14D:
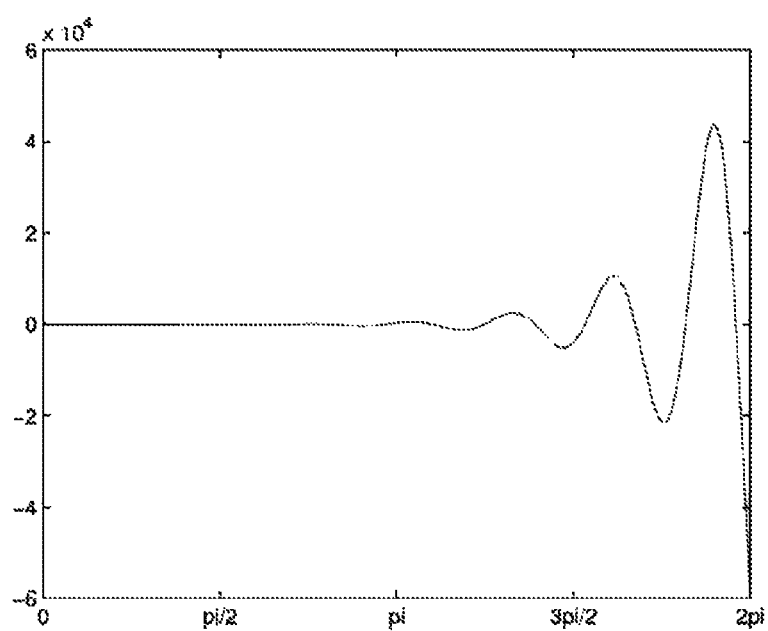

Of the damped complex exponential signal (FIG. 14*a*)

$$f(x)=2\exp(10x/(2\pi))\cos(197.5x)+2\cos(10\sqrt{2}x)+2\exp(x/(2\pi))\cos(x), 0\leq x\leq 2\pi$$

we show the amplitudes and damping factors using three techniques. The Nyquist rate is again M=400, but now t=6 complex exponential terms are involved. In FIG. 14*c* we show the result of de Prony's method on the signal subsampled at an r-fold of the Nyquist rate (r=21): the introduced aliasing is obvious. In FIG. 14*d* we show the signal obtained from de Prony's reconstruction based on this undersampled input. In FIG. 14*b* we show the result of using our technique according to an embodiment of the present invention when complementing the same undersampled data with the samples at $(sr+\rho)\omega$, r=21, $\rho=1$, s=i, ..., i+5 where i is any integer between 0 and 7! The amplitudes, damping factors and frequencies are recovered with very high accuracy. We remark that many r-values relatively prime with M would have done the job (all up to 50 for instance, gave comparable results).

When adding Gaussian noise to the damped synthetic signal, the amplitudes, damping factors and frequencies can be retrieved extremely accurately from the equally (r=21) undersampled data. We find values $$err(\alpha) = \frac{\|\alpha - \tilde{\alpha}\|_2}{\|\alpha\|_2},$$

$$err(\Re(k)) = \frac{\|\Re(k) - \Re(\tilde{k})\|_2}{\|\Re(k)\|_2},$$

$$err(\Im(k)) = \frac{\|\Im(k) - \Im(\tilde{k})\|_2}{\|\Im(k)\|_2}$$

as in the table,

| SNR | err($\alpha$) | err($\Re$(k)) | err($\Im$(k)) |
|---|---|---|---|
| 0.020 (34 dB) | 0.028 | 0.0103 | 0.003203 |
| 0.010 (40 dB) | 0.014 | 0.0050 | 0.000041 |
| 0.001 (60 dB) | 0.001 | 0.0005 | 0.000004 | where $\alpha$, $\Re(k)$ and $\Im(k)$ respectively denote the true amplitude, damping factor and frequency vectors, and $\tilde{\alpha}$, $\Re(\tilde{k})$ and $\Im(\tilde{k})$ respectively denote the computed amplitude, damping factor and frequency vectors of the noisy signal. The error vector norms are averaged over 1000 different random runs.

NOTATION LIST

| | |
|---|---|
| •<<• | much less than |
| \|.\| | absolute value |
| floor(.) | integer part of a number (truncated) |
| ceil(.) | integer part of a number (rounded up) |
| #• | cardinality of a set |
| $\|\cdot\|_2$ | Euclidean norm |
| 1 | characteristic function |
| A, B | matrix |
| $\alpha_i, \alpha_{i,c}, \alpha_{i,s}$ | weight factor in sparse model |
| $\mathbb{C}$ | complex numbers |
| $\gamma_i, \sigma_i$ | radial frequency |
| d | number of parameters of $\phi_k$, may be equal to its number of variables |
| D | diagonal matrix of weight factors |
| $\delta_i, \tau_i$ | phase angle |
| f, f(x), f(x$_1$, ..., x$_d$) | object under study that generates the data |
| $f_s$ | s-th sample value of f |
| $f_{s,\rho}$ | sample taken at a point $\xi^{(s)}$ shifted over $\rho/M$ |
| $\phi_k(x), \phi_k(x_1, \ldots, x_d)$ | component in (sparse) model |
| $\Phi(K^d)$ | set of all $\phi_k$ with k ranging over $K^d$ |
| $\Phi_{i,s}$ | i-th component $\phi_{k_i}$ evaluated at the s-th sample point |
| h, i, j, l, n | indices |
| $H_t^{(0)}, H_t^{(1)}$ | t × t Hankel matrix with upper left element $f_0$ or $f_1$ |
| I | $\sqrt{-1}$ |
| $I_j$ | subset of $\{k^{(1)}, \ldots, k^{(t)}\}$ |
| $\Im(k)$ | imaginary part of parameter k |
| k | single or vector parameter of $\phi_k$ |
| $k^{(i)}, (k_1^{(i)}, \ldots, k_d^{(i)})$ | i-th single or vector parameter in the sparse sum |
| K | admissible set for the single parameter k (d = 1) |
| $K^d$ | admissible set for the vector parameter k (d ≥ 1) |
| $\kappa$ | dimension of the vector space spanned by $\Phi(K^d)$ |
| L | lower triangular matrix |
| $\lambda_i$ | (generalized) eigenvalue |
| $\Lambda$ | diagonal matrix of eigenvalues |
| m, M | Nyquist sampling rate (or similar) |
| mod n | remainder after division by n |
| $\mathbb{N}$ | natural numbers including zero |
| $\omega$ | (argument of) primitive root of unity |
| $p_i$ | prime number |
| $\pi$ | number pi |
| $\mathbb{Q}$ | rational numbers |
| r | magnifying factor |
| $\mathbb{R}$ | real numbers |
| $\Re(k)$ | real part of parameter k |
| $\rho$ | identification shift |
| $\Sigma_{i=1}^t \alpha_i \phi_{k^{(i)}}(x_1, \ldots, x_d)$ | t-sparse linear combination of elements $\phi_k$ |
| t, t$_c$, t$_s$, t$_j$ | cardinality of sparse model |
| T | overestimate for the cardinality t |
| u | 0 or 1 |
| $v_i$ | (generalized) eigenvector |
| V | Vandermonde matrix |
| $V^T$ | transpose of matrix V |
| $V^{-1}$ | inverse of matrix V |
| $\|V\|_\infty$ | infinity-norm of matrix V |
| W | generalized Vandermonde matrix |
| $W^T$ | transpose of matrix W |
| x | single variable of f or $\phi_k$ |
| $x^k$ | monomial |
| (x$_1$, ..., x$_d$) | vector variable of f or $\phi_k$ |
| $x_j$ | j-th coordinate of vector variable (x$_1$, ..., x$_d$) |
| $x_1^{k_1} \ldots x_d^{k_d}$ | multinomial |
| $\xi^{(s)}, (\xi_1^{(s)}, \ldots, \xi_d^{(s)})$ | s-th sample point |
| $\mathbb{Z}$ | integer numbers |

The invention claimed is:

1. A computer-based method for characterizing data dependent on at least one variable, in terms of a family of functions $\phi_k$ having a domain corresponding to said at least one variable and a codomain corresponding to said data, said family of functions sharing a common construction parameterized by at least one parameter k, and values of said family of functions satisfying a recurrence relation that can be expressed as a generalized eigenfunction relation; the method comprising:

obtaining a magnifying factor r for controlling a spacing between elements in a finite sequence of sampling points $\xi^{(j)}$, j=0, 1, 2, ... 2t−1, wherein the data will be sampled, obtaining a finite sequence of measurements $f_j = f(\xi^{(j)})$, j=0, 1, 2, ..., 2t−1 of said data by sampling said data in said finite sequence of sampling points, said sampling being sparse sampling, said finite sequence of sampling points being $\xi^{(j)}$ controlled by said obtained magnifying factor and determined such that the values $\phi_k(\xi^{(j)})$ of the functions of said family of functions in said finite sequence of sampling points satisfy said recurrence relation, and outputting a property of the data satisfying $f_j \approx \sum_{i=1}^t \alpha_i \phi_{k^{(i)}}(\xi^{(j)})$, j=0, 1, 2, ..., 2t−1 where the number of terms t, the support $\{k^{(1)}, \ldots, k^{(t)}\}$, and the nonzero coefficients $\alpha_1, \ldots, \alpha_t$ are unknown, said outputting taking into account said finite sequence of measurements;

wherein the method further comprises determining first sets of values of said at least one parameter k defining a subset of said family of functions, said determining making use of said recurrence relation satisfied in said finite sequence of sampling points by determining the generalized eigenvalues of said generalized eigenfunction relation, and wherein the method comprises further sampling said data in a further finite sequence of sampling points such that a location of said further finite sequence of sampling points is at least also determined by a value of an identification shift for uniquely determining said subset of said family of functions by calculating the intersections of said first sets of values and respective second sets of values of said at least one parameter k obtained from said further finite sequence of sampling points.

2. The method according to claim 1, wherein said outputting a property of the data comprises outputting a representation of the data based on the subset of said family of functions.

3. The method according to claim 2, further comprising determining a set of weight factors for representing said data as a linear combination of said subset of said family of functions.

4. The method according to claim 1, wherein function parameters defining functions of the determined subset of said family of functions are at least not all integer.

5. The method according to claim 1, wherein said magnifying factor is an integer or a rational number.

6. The method according to claim 5, wherein said magnifying factor is different from one.

7. The method according to claim 1, wherein said subset of said family of functions is a sparse subset.

8. The method according to claim 1, wherein selecting the magnifying factor comprises selecting the magnifying factor for controlling a numerical conditioning of said characterizing of said data.

9. The method according to claim 1, wherein selecting the magnifying factor comprises selecting the magnifying factor for reducing the number of sampling points below less than dictated by the Nyquist rate.

10. The method according to claim 1, wherein a cardinality of said finite sequence of sampling points is imposed as a predetermined cardinality, and/or wherein a cardinality of said finite sequence of sampling points is probed for, and/or wherein the cardinality is determined iteratively.

11. The method according to claim 1, wherein the method comprises performing a sparsity check by determining a numerical rank of a matrix or matrices constructed from said recurrence relation using the finite sequence of measurements.

12. The method according to claim 1, in which said determining of said subset comprises applying an inverse application of a technique based on the Chinese remainder theorem.

13. The method according to claim 1, wherein the method comprises performing a divide and conquer step.

14. A nontransitory computer readable medium containing computer instructions stored therein for causing a computer processor to perform a method according to claim 1.

15. A device for characterizing data dependent on at least one variable, the device comprising:

a processor comprising a numerical processing device, the numerical processing device adapted for obtaining, for the data to be characterized, a finite sequence of measurements $f_j=f(\xi^{(j)})$, $j=0, 1, 2, \ldots, 2t-1$ of said data by sampling said data in said finite sequence of sampling points $\xi^{(j)}$, $j=0, 1, 2, \ldots, 2t-1$, said finite sequence of sampling points $\xi^{(j)}$ being controlled by a magnifying factor r for controlling a spacing between elements in the finite sequence of sampling points $\xi^{(j)}$, $j=0, 1, 2, \ldots, 2t-1$, and said finite sequence of sampling points $\xi^{(j)}$ being determined such that the values $\phi_k(\xi^{(j)})$ of the functions of a family of functions in said finite sequence of sampling points satisfy a recurrence relation that can be expressed as a generalized eigenfunction relation, said sampling points being obtained through sparse sampling, and said family of functions having a domain corresponding to said at least one variable and a codomain corresponding to said data and said family of functions sharing a common construction parameterized by at least one parameter k, the numerical processing device furthermore being adapted for determining a property of the data, a memory for storing the finite sequence of measurements, and a display for outputting a property of the data satisfying $f_j \approx \sum_{i=1}^{t} \alpha_i \phi_{k^{(i)}}(\xi^{(j)})$, $j=0, 1, 2, \ldots, 2t-1$, where the number of terms t, the support $\{k^{(1)}, \ldots, k^{(t)}\}$, and the nonzero coefficients $\alpha_1, \ldots, \alpha_t$ are unknown, said outputting taking into account the finite sequence of measurements;

wherein the numerical processing device is further adapted for determining first sets of values of said at least one parameter k defining a subset of said family of functions, said determining making use of said recurrence relation satisfied in said finite sequence of sampling points by determining the generalized eigenvalues of said generalized eigenfunction relation, and wherein the numerical processing device is further adapted for sampling said data in a further finite sequence of sampling points such that a location of said further finite sequence of sampling points is at least also determined by a value of an identification shift for uniquely determining said subset of said family of functions, by calculating the intersections of said first sets of values and respective second sets of values of said at least one parameter k obtained from said further finite sequence of sampling points.

16. A device according to claim 15, the device furthermore comprising a sensor for obtaining one or more of the data to be characterized, the family of functions or the magnifying factor.

* * * * *